(12) United States Patent
Ogawa

(10) Patent No.: US 11,929,590 B2
(45) Date of Patent: Mar. 12, 2024

(54) METHOD FOR PRODUCING OPTICAL SEMICONDUCTOR DEVICE

(71) Applicant: Mitsubishi Electric Corporation, Tokyo (JP)

(72) Inventor: Nobuyuki Ogawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 641 days.

(21) Appl. No.: 17/264,421

(22) PCT Filed: Nov. 6, 2018

(86) PCT No.: PCT/JP2018/041093
§ 371 (c)(1),
(2) Date: Jan. 29, 2021

(87) PCT Pub. No.: WO2020/095355
PCT Pub. Date: May 14, 2020

(65) Prior Publication Data
US 2021/0313765 A1    Oct. 7, 2021

(51) Int. Cl.
*H01L 31/02*  (2006.01)
*H01S 5/02*  (2006.01)
(Continued)

(52) U.S. Cl.
CPC .... *H01S 5/04256* (2019.08); *H01L 31/02005* (2013.01); *H01S 5/0203* (2013.01); *H01S 5/02335* (2021.01); *H01S 5/02345* (2021.01); *H01S 5/028* (2013.01); *H01S 5/0268* (2013.01); *H01S 5/06213* (2013.01); *H01S 5/06226* (2013.01); *H01S 5/4087* (2013.01)

(58) Field of Classification Search
CPC ... H01L 31/02005; H01S 5/0427; H01S 5/12; H01S 5/042
See application file for complete search history.

(56) References Cited

U.S. PATENT DOCUMENTS 6,437,899 B1 * 8/2002 Noda ................. G02F 1/025
                                                    359/245
2003/0169796 A1   9/2003 Nakamura et al.
(Continued)

FOREIGN PATENT DOCUMENTS

JP    S64-050590 A   2/1989
JP    H09-172221 A   6/1997
(Continued)

OTHER PUBLICATIONS

International Search Report issued in PCT/JP2018/041093; dated Feb. 5, 2019.

*Primary Examiner* — David Vu
(74) *Attorney, Agent, or Firm* — Studebaker & Brackett PC

(57) ABSTRACT

An optical semiconductor device includes an optical semiconductor chip in which at least one optical element is formed in a semiconductor substrate, and an extended wire pattern that is connected to a first electrode and a second electrode of the optical element and that extends outside the optical semiconductor chip. The first electrode and the second electrode of the optical semiconductor device are formed on the front surface side of the optical semiconductor chip, and the extended wire pattern is disposed on the front surface of the optical semiconductor chip or disposed at a position apart from the front surface.

10 Claims, 12 Drawing Sheets

(51) Int. Cl.
*H01S 5/02335* (2021.01)
*H01S 5/02345* (2021.01)
*H01S 5/028* (2006.01)
*H01S 5/042* (2006.01)
H01S 5/026 (2006.01)
H01S 5/062 (2006.01)
H01S 5/40 (2006.01)

(56) References Cited

U.S. PATENT DOCUMENTS

| | | |
|---|---|---|
| 2003/0231685 A1 | 12/2003 | Nakamura et al. |
| 2012/0128375 A1 | 5/2012 | Kimoto et al. |
| 2012/0170944 A1 | 7/2012 | Yagisawa et al. |
| 2017/0310078 A1 | 10/2017 | Hirayama |
| 2019/0131762 A1 | 5/2019 | Hirayama |

FOREIGN PATENT DOCUMENTS

| | | |
|---|---|---|
| JP | 2003-264334 A | 9/2003 |
| JP | 2009-224711 A | 10/2009 |
| JP | 2011-035060 A | 2/2011 |
| JP | 2012-142822 A | 7/2012 |
| JP | 2013-077753 A | 4/2013 |
| JP | 2016-162804 A | 9/2016 |
| JP | 2016-181542 A | 10/2016 |
| JP | 2017-199905 A | 11/2017 |

\* cited by examiner

METHOD FOR PRODUCING OPTICAL SEMICONDUCTOR DEVICE

TECHNICAL FIELD

The present application relates to an optical semiconductor device and an optical module.

BACKGROUND ART

An optical module is a device used for optical communication or the like. A wavelength-division multiplexing optical module has been developed to increase the capacity and speed of optical communication. For example, in FIG. 7 of Patent Document 1, a multi-channel optical transmitter (optical module) that outputs an optical signal obtained by multiplexing optical signals of four wavelengths is disclosed. The multi-channel optical transmitter disclosed in FIG. 7(a) of Patent Document 1 includes a chip (optical semiconductor device) of an optical element in which direct modulated distributed feedback lasers (DML) for four wavelengths (four channels) are formed, and a wiring board (high-frequency substrate) connected to a driver integrated circuit (IC) for driving the four DMLs. And anode electrodes and cathode electrodes of the four DMLs are connected to the wiring board with eight wires. In addition, the multi-channel optical transmitter disclosed in FIG. 7(a) of Patent Document 1 includes a termination resistor connected to a p-type semiconductor substrate of the DMLs in order to achieve impedance matching with the output impedance of the driver IC for driving, which is typically 50Ω.

In FIG. 7(c) of Patent Document 1, a multi-channel optical transmitter is disclosed in which the chip of the optical element having four DMLs formed therein and a high-frequency circuit board (high-frequency substrate) are flip-chip bonded with gold bumps. Wiring formed on the rear surface of the high-frequency circuit board is connected to the anode electrodes and the cathode electrodes of the four DMLs with gold bumps.

CITATION LIST

Patent Document

Patent Document 1: Japanese Patent Application Laid-open No. 2016-181542 (FIG. 7)

SUMMARY OF INVENTION

Problems to be Solved by Invention

In the multi-channel optical transmitter disclosed in FIG. 7(a) of Patent Document 1, since the anode electrodes and the cathode electrodes of the four DMLs of the optical semiconductor device are connected to the wiring board with eight wires, the path length between the driver IC, etc. and the optical semiconductor device is long due to the length of the wires, and thus high-frequency characteristics deteriorate. In the case where the mounting structure of the optical semiconductor device and the wiring board is not changed and the value of the termination resistance is not adjusted for each optical module, only a measure is to reduce the wire loop length as much as possible, and thus high-frequency characteristics of the optical module in which the optical semiconductor device is mounted cannot be sufficiently improved. In addition, in the case where the value of the termination resistance is adjusted for each optical module without changing the mounting structure of the optical semiconductor device and the wiring board, a problem arises in that the adjustment work of the optical module is long.

Further, in the multi-channel optical transmitter disclosed in FIG. 7(c) of Patent Document 1, the optical semiconductor device in which four DMLs are formed and the high-frequency circuit board (high-frequency substrate) are flip-chip bonded with gold bumps; namely, they are connected by a flip-chip mounting method. It is generally known that such a flip-chip mounting method minimizes the path length between the driver IC, etc. and the optical semiconductor device to improve the high frequency characteristics. However, the mounting method using bumps cannot be easily applied because of a problem of reliability in the current situation. Further, there is also a mounting method in which an optical semiconductor device formed in a junction-down structure is turned upside down and connected with bumps, but this method cannot be easily applied because of a problem of reliability and the like in the current situation.

It is an object of the technology disclosed in the specification of the present application to obtain an optical semiconductor device that can be connected to the high-frequency substrate via a shorter path than the wire connection and without using the flip-chip mounting method when the optical semiconductor device is connected to the high-frequency substrate.

Means for Solving Problems

An example of an optical semiconductor device disclosed in the specification of the present application is an optical semiconductor device includes an optical semiconductor chip in which at least one optical element is formed on a semiconductor substrate, and an extended wire pattern connected to a first electrode and a second electrode in the optical element and extends outside the optical semiconductor chip. The first electrode and the second electrode are formed on the front surface side of the optical semiconductor chip, and the extended wire pattern is disposed on the front surface of the optical semiconductor chip or at a position apart from the front surface.

Effect of Invention

An example of the optical semiconductor device disclosed in the specification of the present application includes the extended wire pattern connected to the first electrode and the second electrode of the optical element and extends outside the optical semiconductor chip. Therefore, when connected to the high-frequency substrate, the optical semiconductor device can be connected to the high-frequency substrate via the path shorter than the wire connection and without using the flip-chip mounting method.

MODES FOR CARRYING OUT INVENTION

Embodiment 1

Figure 1:
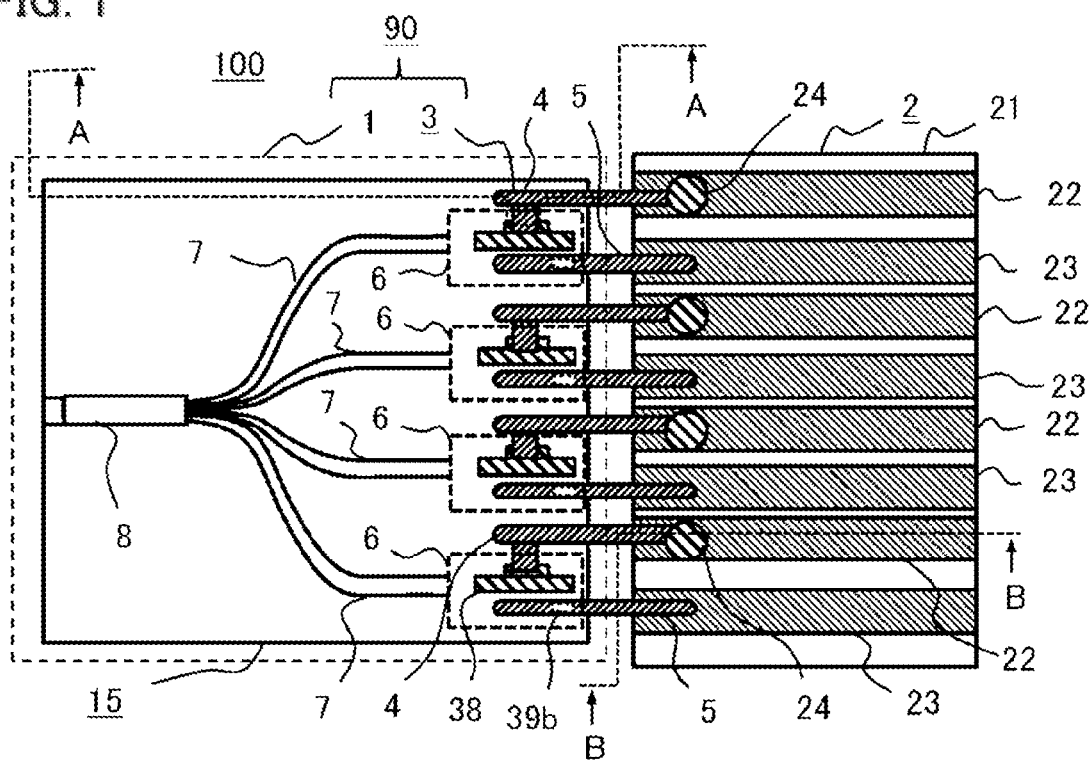
FIG. 1 is a diagram showing an optical semiconductor device and an optical module according to Embodiment 1.
Figure 2:
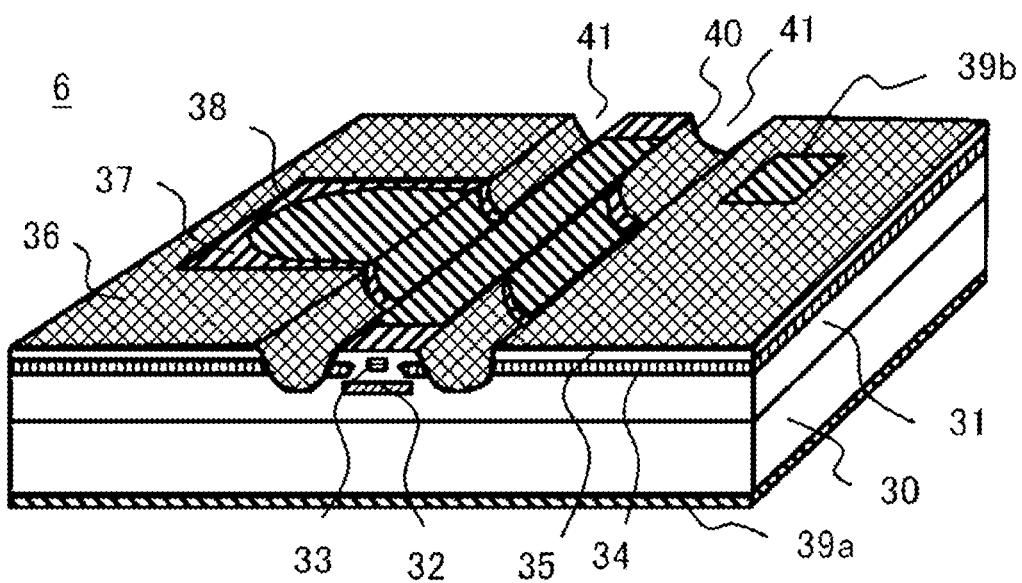
FIG. 2 is a diagram showing a semiconductor laser of FIG. 1.
Figure 3:
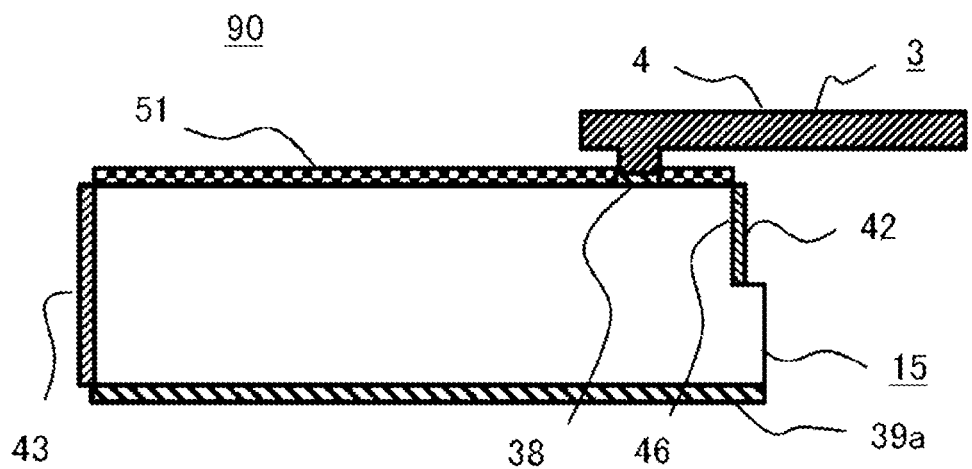
FIG. 3 is a cross-sectional diagram taken along the line A-A in FIG. 1.
Figure 4:
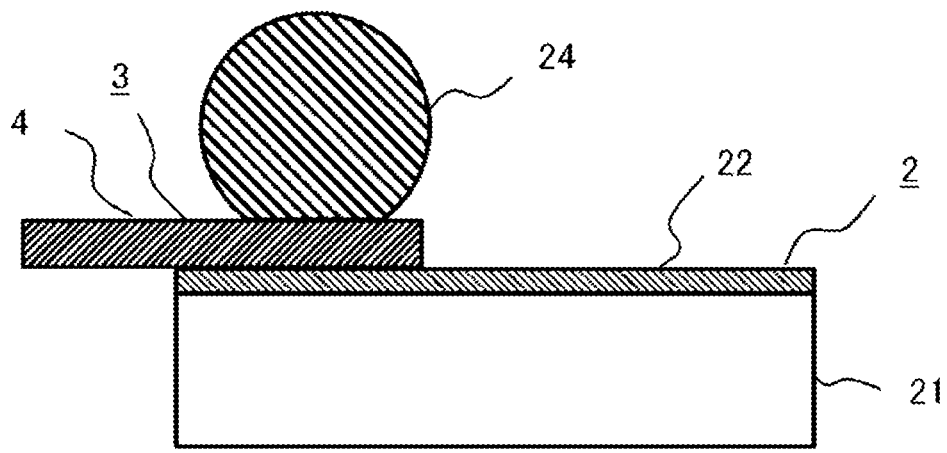
FIG. 4 is a cross-sectional diagram taken along the line B-B in FIG. 1.
Figure 5:
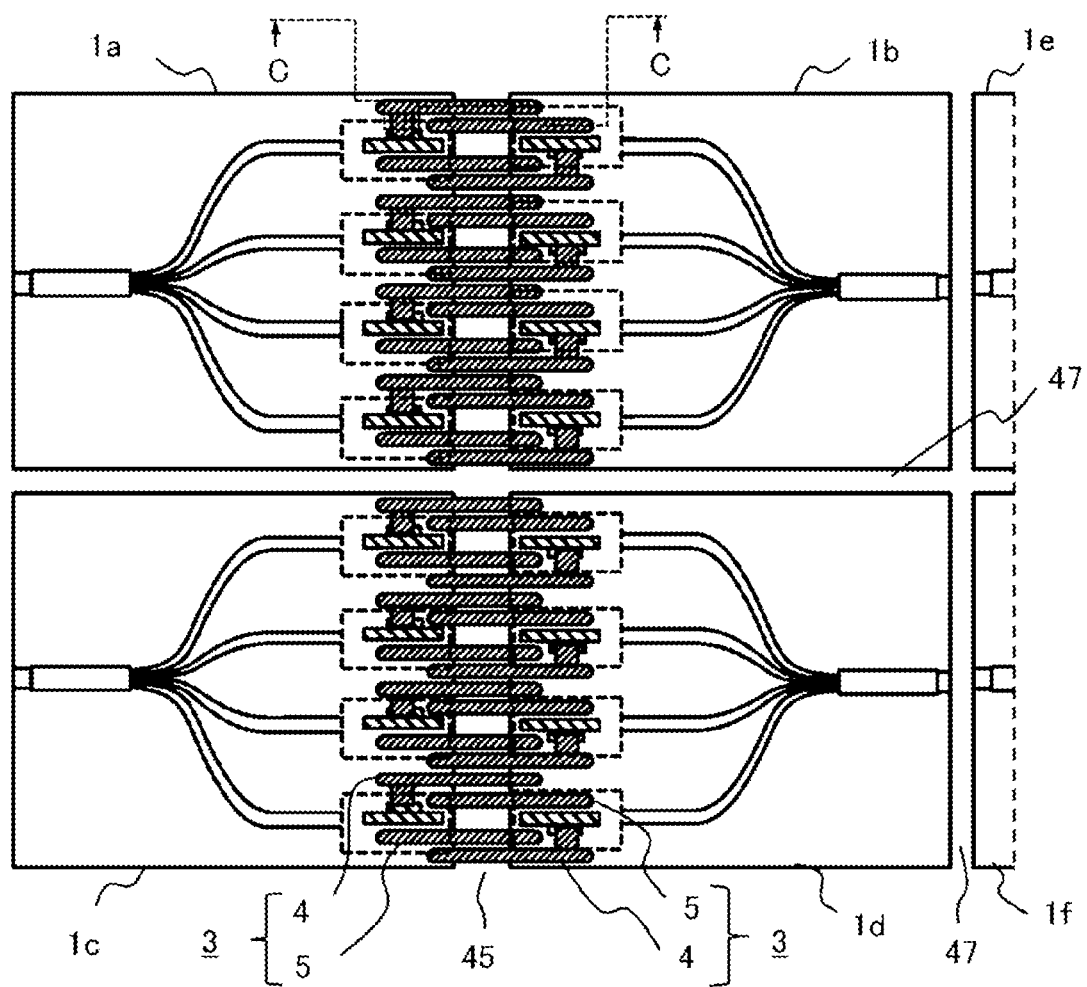
FIG. 5 is a diagram showing four optical semiconductor chips and extended wire patterns before chip separation according to Embodiment 1.
Figure 6:
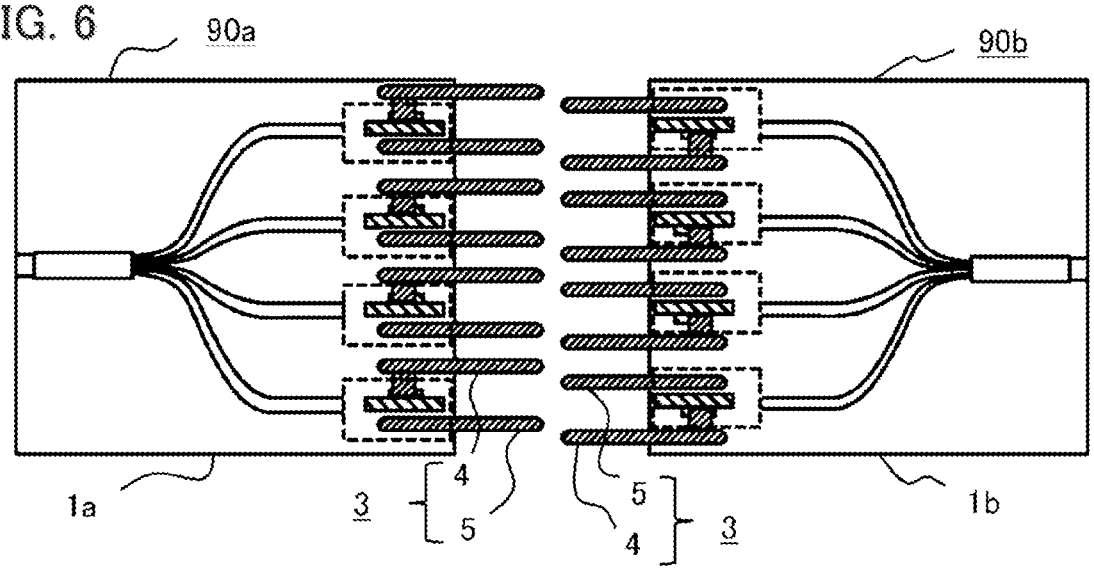
FIG. 6 is a diagram showing two optical semiconductor devices after the chip separation according to Embodiment 1.

An optical semiconductor device 90 and an optical module 100 according to Embodiment 1 will be described referring to the drawings. The same or corresponding components are denoted by the same reference numerals, and repetitive description thereof may be omitted. FIG. 1 is a diagram showing an optical semiconductor device and an optical module according to Embodiment 1, and FIG. 2 is a diagram showing a semiconductor laser of FIG. 1. FIG. 3 is a cross-sectional diagram taken along the line A-A in FIG. 1, and FIG. 4 is a cross-sectional diagram taken along the line B-B in FIG. 1. FIG. 5 is a diagram showing four optical semiconductor chips and extended wire patterns before chip separation according to Embodiment 1, and FIG. 6 is a diagram showing two optical semiconductor devices after the chip separation according to Embodiment 1. FIGS. 7 to 14 are diagrams for explaining forming steps of the extended wire patterns according to Embodiment 1. The optical semiconductor device 90 includes an optical semiconductor chip 1 in which an optical element is formed on a semiconductor substrate, and an extended wire pattern 3 connected to electrodes of the optical element and extends outside the outer periphery of the optical semiconductor chip 1. The optical module 100 includes the optical semiconductor device 90 and a high-frequency substrate 2 connected to the extended wire pattern 3 of the optical semiconductor device 90. FIG. 1 shows an example in which the optical semiconductor chip 1 is an integrated semiconductor laser chip 15 in which four semiconductor lasers 6 are integrated. FIG. 1 shows an example in which the extended wire pattern 3 extends outside from only one end side of the optical semiconductor chip 1. One end of the optical semiconductor chip 1 where the extended wire pattern 3 extends outside is an extended wire arrangement end.

The integrated semiconductor laser chip 15 being the optical semiconductor chip 1 includes four semiconductor lasers 6, four waveguides 7 that each transmit an optical signal output from each semiconductor laser 6, and a spot-size converter 8 that couples the four waveguides 7 and changes the spot size of the transmitted optical signal. The four semiconductor lasers 6 are direct modulated distributed feedback lasers. The distributed feedback laser selects and emits light of a single wavelength by using a diffraction grating that provides a periodic refractive index change. The direct modulated distributed feedback laser includes the diffraction grating, and outputs an optical signal of a single wavelength modulated by oscillating (emission) and non-oscillating (non-emission) laser light by turning on and off a driving voltage by a driver that drives the semiconductor lasers 6. The semiconductor laser 6 includes a p-type InP substrate 30, a p-type cladding layer 31, a diffraction grating layer 32 constituting a diffraction grating, an active layer 33, a current blocking layer 34, an n-type cladding layer 35, a contact layer 37, an insulating film 36, an anode electrode 39a formed on a rear surface of the InP substrate 30, an anode electrode 39b formed on a front surface of the insulating film 36, and a cathode electrode 38 formed on a front surface of the contact layer 37. The anode electrode 39a and the anode electrode 39b are connected to each other. In the semiconductor laser 6, a mesa stripe 40 is formed by two laser separation grooves 41. The four semiconductor lasers 6 output, for example, laser light of 1.3 μm band by the diffraction grating layer 32. The semiconductor lasers 6 that are formed in the integrated semiconductor laser chip 15 output different wavelengths, and the integrated semiconductor laser chip 15 multiplexes four wavelengths and outputs an optical signal. Although a passivation layer 51 is formed on the front surface of the integrated semiconductor laser chip 15, the passivation layer 51 is omitted in FIG. 2.

In the integrated semiconductor laser chip 15, an anti-reflection film 43 is coated on a front end face on a side where the optical signal is outputted, and a high reflection film 42 for reflecting the laser light is coated on a rear end face being opposite side to the front end face. The high reflection film 42 is formed on a laser rear end face 46 that is a side face of a chip separation groove 45 separating two integrated semiconductor laser chips 15 formed adjacent to each other before the separation. The anti-reflection film 43 is an optical material film through which the laser light passes without being reflected by the laser rear end face 46. The extended wire pattern 3 is formed so as not to be in contact with the front surface of the passivation layer 51 formed on the surface opposite to the rear surface of the integrated semiconductor laser chip 15. The extended wire pattern 3 includes an extended wire 4 connected to the cathode electrode 38 of the semiconductor laser 6 via an opening of the passivation layer 51, and an extended wire 5 connected to the anode electrode 39b of the semiconductor laser 6 via an opening of the passivation layer 51. The extended wire pattern 3 extends outside the laser rear end face 46 of the semiconductor laser 6. In FIG. 1, the anode electrode 39b is shown by a broken line rectangle in white for easy understanding. Since the integrated semiconductor laser chip 15 includes four semiconductor lasers 6, it includes a total of eight extended wires 4 and 5.

In the high-frequency substrate 2, a plurality of metal lines 22 and 23 are formed on the front surface of a substrate 21 made of ceramic or the like. FIG. 1 shows four metal lines 22 connected for each of the cathode electrodes 38 of the semiconductor lasers 6 via the extended wires 4 and four metal lines 23 each connected for each of the anode electrodes 39b of the semiconductor lasers 6 via the extended wires 5. The extended wires 4 and 5 as the extended wire pattern 3 of the semiconductor chip 1 are connected to the metal lines 22 and 23 of the high-frequency substrate 2 by thermo-compression bonding. The other ends of the metal lines 22 and 23 to which the extended wires 4 and 5 are not connected are connected to an external device on which the driver or the like for driving the semiconductor lasers 6 is mounted, with unshown gold wires or the like. A high-frequency voltage for driving the semiconductor lasers 6 is applied to the metal lines 22 and 23 of the high-frequency substrate 2. For example, when each of the semiconductor lasers 6 outputs an optical signal of 25 Gbps, the high-frequency voltage of 12.5 GHz at maximum is applied to the metal lines 22 and 23 of the high-frequency substrate 2.

FIG. 1 shows an example in which gold balls (Au balls) 24 are formed on the front surfaces of the extended wires 4, that is, the surfaces opposite to the surfaces facing the front surfaces of the metal lines 22 on the high-frequency substrate 2. The gold balls 24 are used in a case where connection is made to wiring, etc. of the external device at the shortest distance. Since the gold balls 24 formed on the front surfaces of the extended wires 4 are larger than the gold bumps of Patent Document 1, highly reliable connection with the external device is possible even when the gold balls 24 are used. The gold balls 24 may be formed on the front surfaces of the extended wires 5 (refer to FIG. 21).

An arrangement of the four optical semiconductor chips 1a, 1b, 1c, and 1d and the extended wire patterns 3 before separation will be described referring to FIG. 5. A plurality of chip regions are arranged on the same semiconductor substrate (InP substrate 30), and the optical semiconductor chip 1 is formed in each chip region. A chip region is, for example, a region indicated by solid lines on the outer periphery of the optical semiconductor chip 1. The optical semiconductor chips 1a and 1b are arranged such that the laser rear end faces 46 face each other across the chip separation groove 45. The extended wires 4 and 5 as the extended wire pattern 3 of the optical semiconductor chip 1a extend to the optical semiconductor chip 1b beyond the chip separation groove 45. The optical semiconductor chip 1b is formed in the semiconductor substrate (InP substrate 30) with the arrangement in which the optical semiconductor chip 1a is rotated by 180°. The optical semiconductor chips 1c and 1d are formed with the arrangement in which the optical semiconductor chips 1a and 1b are moved in parallel across a scribe line 47. The front end faces of the optical semiconductor chips 1b and 1d face the front end faces of the optical semiconductor chips 1e and if across the scribe line 47. Therefore, the front end faces of the adjacent optical semiconductor chips 1 face each other, and the laser rear end faces 46 of the adjacent optical semiconductor chips 1 face each other. Note that the laser rear end face 46 of the optical semiconductor chip 1 is one end of the optical semiconductor chip 1 where the extended wire pattern 3 extends outside, and thus is also an extended wire arrangement end.

A plurality of basic arrangements of the optical semiconductor chips 1a and 1b are made in the semiconductor substrate via scribe lines 47. Note that, in FIG. 5, in the optical semiconductor chip 1a, the unshown scribe lines 47 are also formed on the outer periphery that is neither in contact with the chip separation groove 45 or the scribe line 47 separating the optical semiconductor chip 1c. Similarly, in the optical semiconductor chips 1b, 1c, and 1d, the unshown scribe lines 47 are also formed in the outer peripheries that are neither in contact with the chip separation grooves 45 or the scribe lines 47 separating adjacent other optical semiconductor chips. In the scribe lines 47, the passivation layer 51 and the insulating film 36 are removed by etching.

When a portion of the extended wire 4 extending outside the optical semiconductor chip 1 is referred to as a first extended portion and a portion of the extended wire 5 extending outside the optical semiconductor chip 1 is referred to as a second extended portion, an interval between the first extended portion and the second extended portion is wider than one of the width of the first extended portion and the width of the second extended portion in a direction perpendicular to the extension direction. Note that the widths of the first extended portion and the second extended portion may be the same or different. FIGS. 1, 5, and 6 show examples in which the first extended portion and the second extended portion are arranged in parallel. In the case where the first extended portion and the second extended portion are arranged in parallel, the extended wire patterns 3 in the optical semiconductor chips 1a and 1b of the basic arrangement that are adjacent to each other across the chip separation groove 45 can be formed with one chip being rotated by 180° with respect to the other chip.

The optical semiconductor chips 1a, 1b, 1c, and 1d are separated into individual chips by cutting the semiconductor substrate along the scribe lines 47 by a dicing apparatus, and by cutting it by the dicing apparatus to the bottom of the chip separation grooves 45 from the rear surface side of the semiconductor substrate on which the extended wire patterns 3 are not formed. FIG. 6 shows two optical semiconductor chips 1a and 1b and two optical semiconductor devices 90a and 90b with the extended wire patterns 3 of one of the optical semiconductor chips 1 moved in parallel so as to be separated from the laser rear end face 46 of the other chip.

A method for producing the optical module 100 will be described. In an optical element forming step, at least one optical element is formed in the semiconductor substrate. In the case of the integrated semiconductor laser chip 15, four semiconductor lasers 6, four waveguides 7, and one spot-size converter 8 are formed on the p-type InP substrate 30 in the optical element forming step. First, structures of the four semiconductor lasers 6, the four waveguides 7, and the one spot-size converter 8 are formed on the InP substrate 30 (optical element structure forming step). After the optical element structure forming step, the passivation layer 51 is formed on the front surface opposite to the rear surface of the InP substrate 30 (passivation layer forming step). After the passivation layer forming step, a chip separation groove 45 is formed by dry etching so as to form a part of the rear end face (laser rear end face 46) of an adjacent integrated semiconductor laser chip 15 (separation groove forming step). The separation groove forming step is a step of forming the chip separation groove 45 by dry etching between chip regions where the extended wire arrangement ends are adjacent to each other. The laser rear end face 46 of the integrated semiconductor laser chip 15 is coated with the high reflection film 42 (rear end face reflection film forming step). Openings for exposing parts of the front surfaces of the cathode electrodes 38 and the anode electrodes 39*a* that are to be connected to the extended wire patterns 3 are formed in the passivation layer 51 (front surface electrode exposure step).

After the optical element forming step, as shown in FIG. 5, the extended wire pattern 3 is formed to extend beyond the chip separation groove 45 to the adjacent optical semiconductor chip 1 (extended wire pattern forming step). The extended wire pattern 3 has a structure in which at least the extended wire pattern 3 outside the region of one chip is not in contact with and floats above the passivation layer 51 of the other chip, by using, for example, two-layer resist. The extended wire pattern 3 of the optical semiconductor chip 1*a* is arranged to extend to the optical semiconductor chip 1*b* without contacting the passivation layer 51 of the optical semiconductor chip 1*b*. Similarly, the extended wire pattern 3 of the optical semiconductor chip 1*b* is arranged to extend to the optical semiconductor chip 1*a* without contacting the passivation layer 51 of the optical semiconductor chip 1*a*. Details of the steps of forming the extended wire pattern 3 will be described later.

After the extended wire pattern forming step, the separation is made by the dicing apparatus on the scribe lines 47 and the bottom of the chip separation grooves 45 (chip separation step). In the chip separation step, the optical semiconductor chips 1*a*, 1*b*, 1*c*, and 1*d* are separated into individual chips by cutting the semiconductor substrate along the scribe lines 47 by the dicing apparatus, and by cutting it by the dicing apparatus to the bottom of the chip separation grooves 45 from the rear surface side of the semiconductor substrate on which the extended wire patterns 3 are not formed. When the chips are individually separated in the chip separation step, a structure is formed in which the extended wire patterns 3 extend outside the chip as shown in FIG. 6. After the chip separation step, the front end face side of the integrated semiconductor laser chip 15 is cleaved, and the cleaved end face is covered with the anti-reflection film 43 (front end face film forming step). The anti-reflection film 43 is an optical material film through which the laser light passes without being reflected by the laser rear end face 46. Without performing the rear end face reflection film forming step, it is difficult to coat the rear end face of the integrated semiconductor laser chip 15, namely the laser rear end face 46, with the high reflection film 42 after the chip separation step because of the extended wire patterns 3 extending outside the chip. Therefore, as described above, the laser rear end face 46 of the integrated semiconductor laser chip 15 is covered with the high reflection film 42 in the wafer process before the chip separation step, namely in the rear end face reflection film forming step.

After the chip separation step and the front end face film forming step, the extended wires 4 and 5 as the extended wire pattern 3 of the optical semiconductor chip 1 are connected to the metal lines 22 and 23 of the high-frequency substrate by the thermo-compression bonding (high-frequency substrate connection step). In the high-frequency substrate connection step, the gold balls 24 are formed on the front surfaces of the extended wires 4 and 5 (gold ball forming step). Note that the gold ball forming step is not performed, when the gold balls 24 are not formed on the front surfaces of the extended wires 4 and 5.

Figure 7:
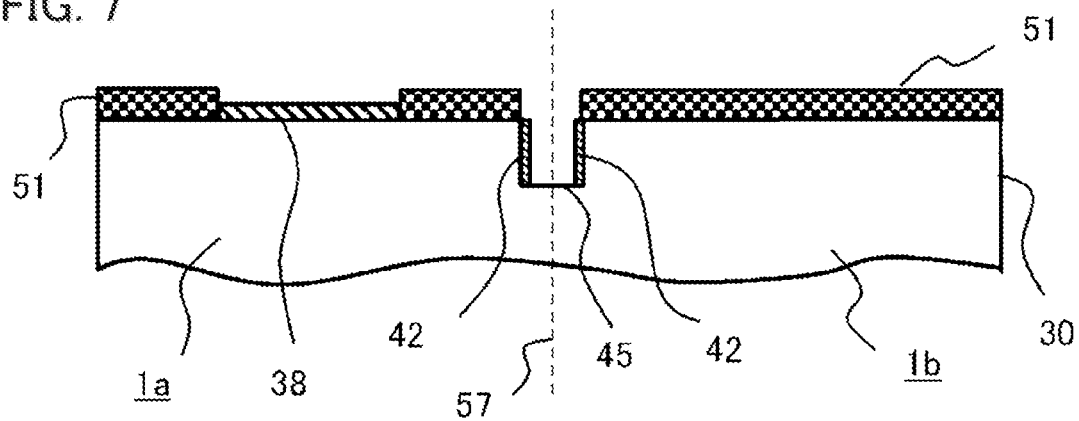
FIG. 7 is a diagram for explaining a forming step of the extended wire patterns according to Embodiment 1.
Figure 8:
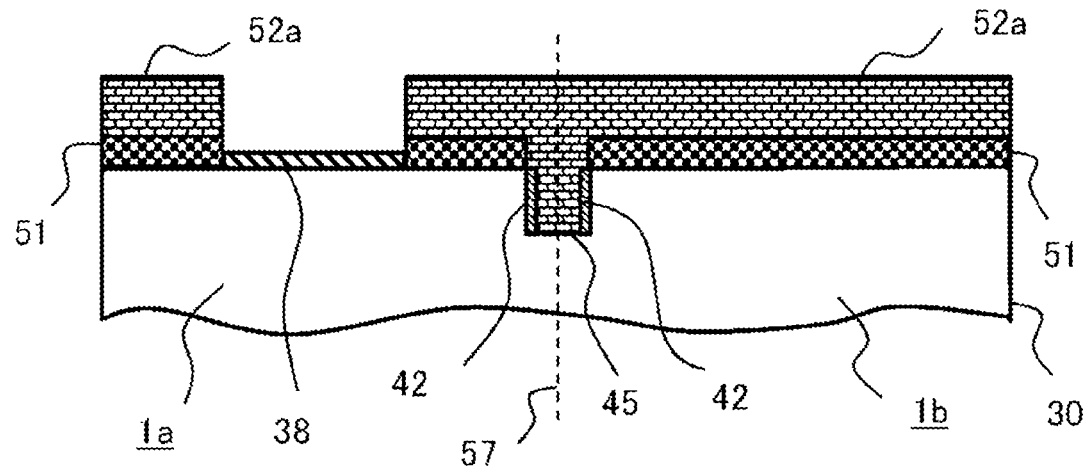
FIG. 8 is a diagram for explaining a forming step of the extended wire patterns according to Embodiment 1.

A forming step in which the extended wire pattern 3 is formed will be described referring to FIGS. 7 to 14. FIGS. 7 to 14 show cross sections taken along the line C-C in FIG. 5. FIG. 7 shows a state in which the optical element forming step described above is completed. The passivation layer 51 is an insulating film such as $SiO_2$ or $Si_3N_4$. The optical semiconductor chip 1*a* is in the left side of the broken line 57, and the optical semiconductor chip 1*b* is in the right side of the broken line 57. In the first resist pattern forming step being the first step of the extended wire pattern forming step, a resist is applied to the entire surface as shown in FIG. 8, and a resist pattern 52*a* is formed by exposure and development. The resist pattern 52*a* is a pattern in which the openings are formed to expose front surface electrode exposing portions exposed by the openings of the passivation layer 51 in the cathode electrodes 38 and the anode electrodes 39*b* that are front surface electrodes of the optical semiconductor chip 1. FIG. 8 shows an example in which the opening of the passivation layer 51 and the opening of the resist pattern 52*a* are not misaligned. Note that the cross section of the cathode electrode 38 shown in FIG. 8 shows a cross section of a portion where the cathode electrode 38 is to be connected to the extended wire 4.

Figure 9:
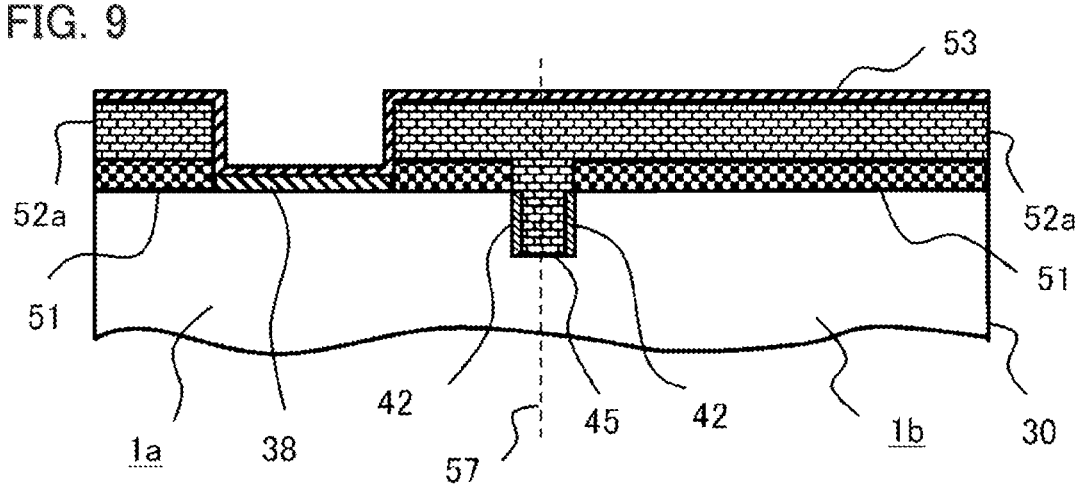
FIG. 9 is a diagram for explaining a forming step of the extended wire patterns according to Embodiment 1.
Figure 10:
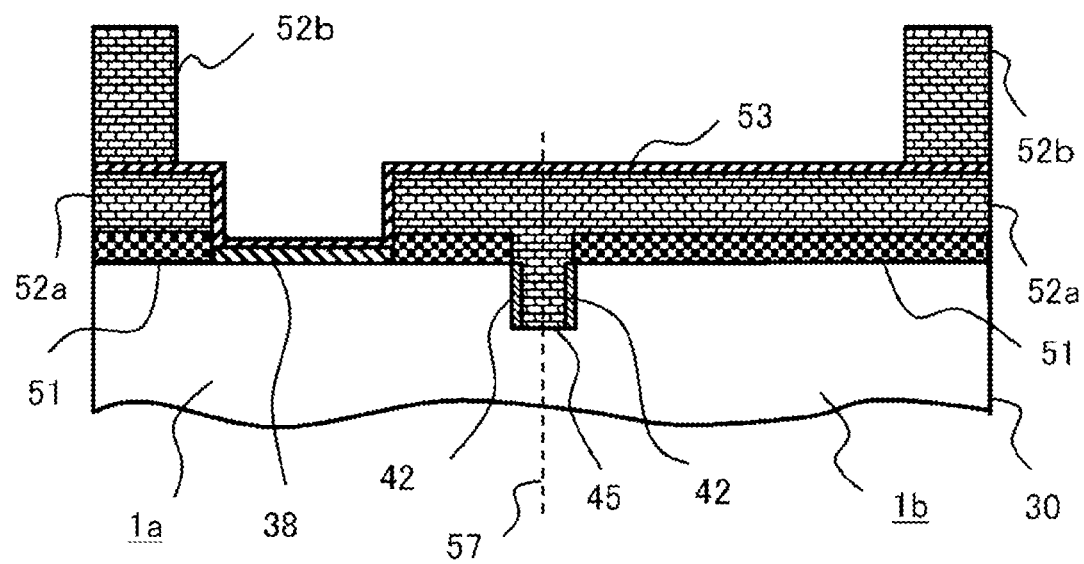
FIG. 10 is a diagram for explaining a forming step of the extended wire patterns according to Embodiment 1.

In the first metal layer forming step being the second step of the extended wire pattern forming step, a first metal layer 53 is formed on the entire surface as shown in FIG. 9. The first metal layer 53 is, for example, two-layered film of a Ti film and an Au film. The Ti film is in contact with the cathode electrode 38 and the anode electrode 39*b* which are front surface electrodes of the optical semiconductor chip 1, and the Au film is formed on the front surface of the Ti film. In the second resist pattern forming step being the third step of the extended wire pattern forming step, a resist is applied to the entire surface and a resist pattern 52*b* is formed by exposure and development as shown in FIG. 10. An opening having the same front surface shape as that of the extended wire pattern 3, namely the front surface shape of the extended wires 4 and 5 is formed in the resist pattern 52*b*. The front surface shape of the extended wire pattern 3 is the shape of the extended wire pattern 3 shown in FIG. 5.

Figure 11:
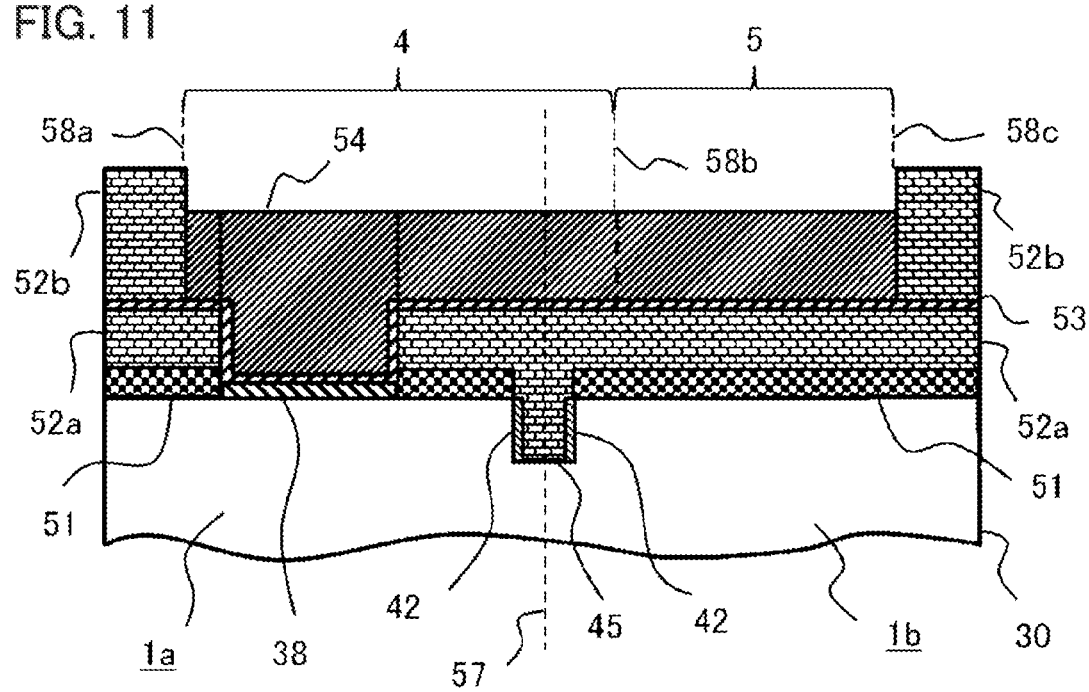
FIG. 11 is a diagram for explaining a forming step of the extended wire patterns according to Embodiment 1.

In the second metal layer forming step being the fourth step of the extended wire pattern forming step, plating is performed using the first metal layer 53 as a power supply layer to form a second metal layer 54 as shown in FIG. 11. In FIG. 11, a portion from a broken line 58*a* to a broken line 58*b* indicates the extended wire 4, and a portion from a broken line 58*b* to a broken line 58*c* indicates the extended wire 5. Although the extended wire 4 and the extended wire 5 are separated from each other, in the cross section taken along the line C-C in FIG. 5, the extended wire 5 is disposed on the front side of the paper plane of FIG. 11 and the extended wire 4 is disposed on the rear side of the paper plane of FIG. 11, and thus the extended wire 5 and the extended wire 4 are seen to overlap each other. Note that the first metal layer 53 also serves as a barrier metal that prevents the front surface electrodes (cathode electrode 38 and anode electrode 39*b*) of the optical semiconductor chip 1 and the second metal layer 54 from being alloyed with each other, in the case where the front surface electrodes (cathode electrode 38 and anode electrode 39*b*) and the second metal layer 54 are made of metallic materials that can be alloyed with each other.

Figure 12:
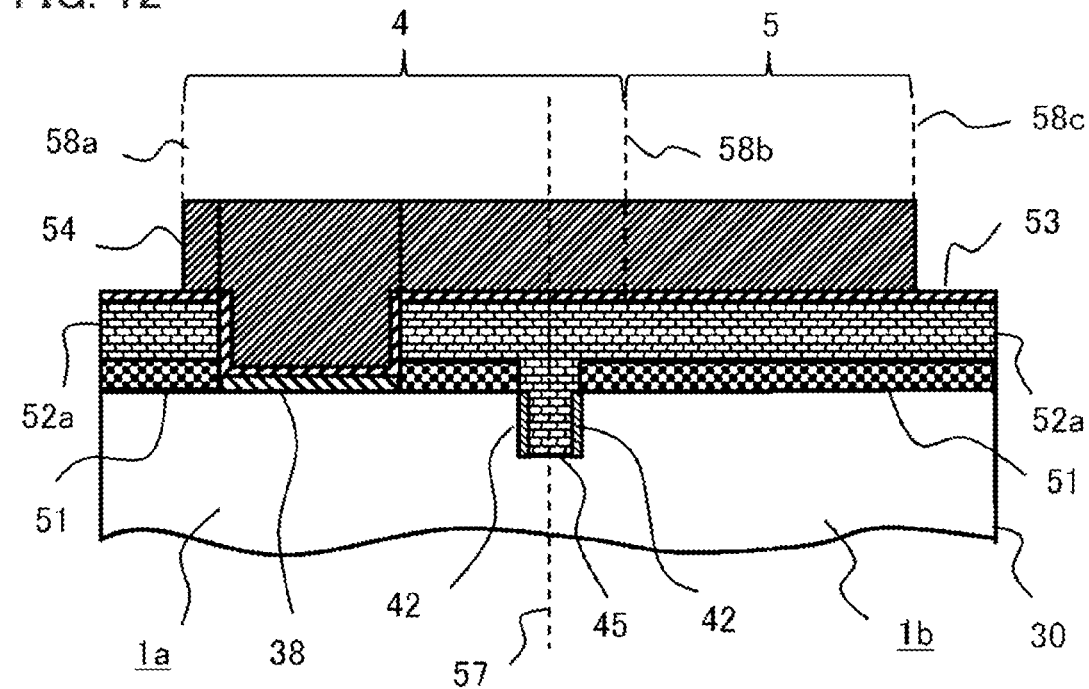
FIG. 12 is a diagram for explaining a forming step of the extended wire patterns according to Embodiment 1.
Figure 13:
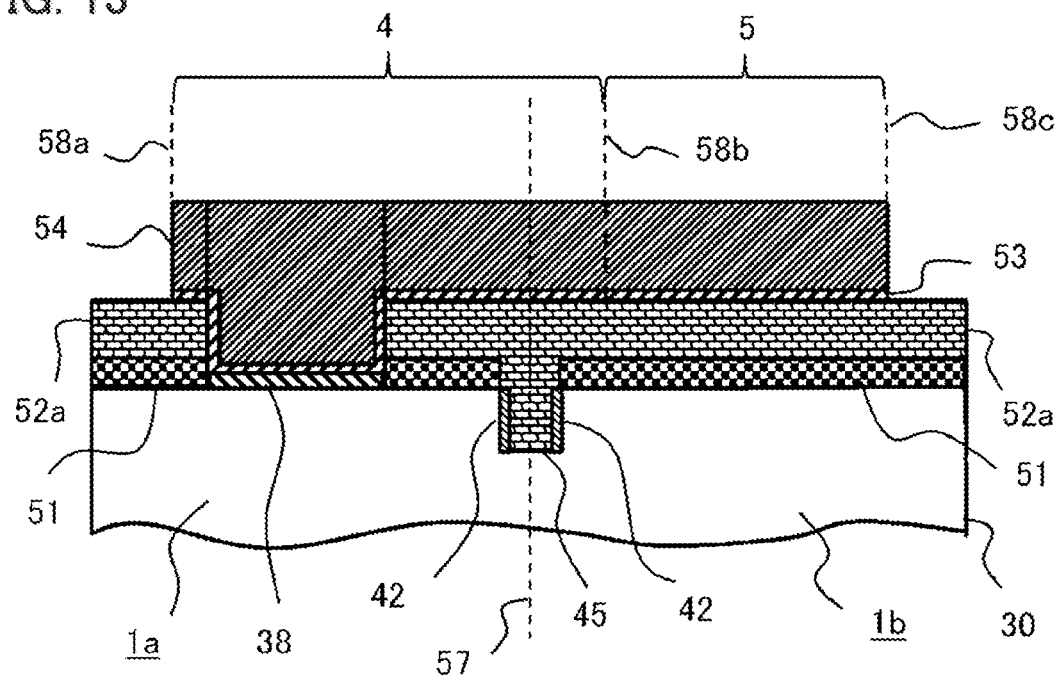
FIG. 13 is a diagram for explaining a forming step of the extended wire patterns according to Embodiment 1.
Figure 14:
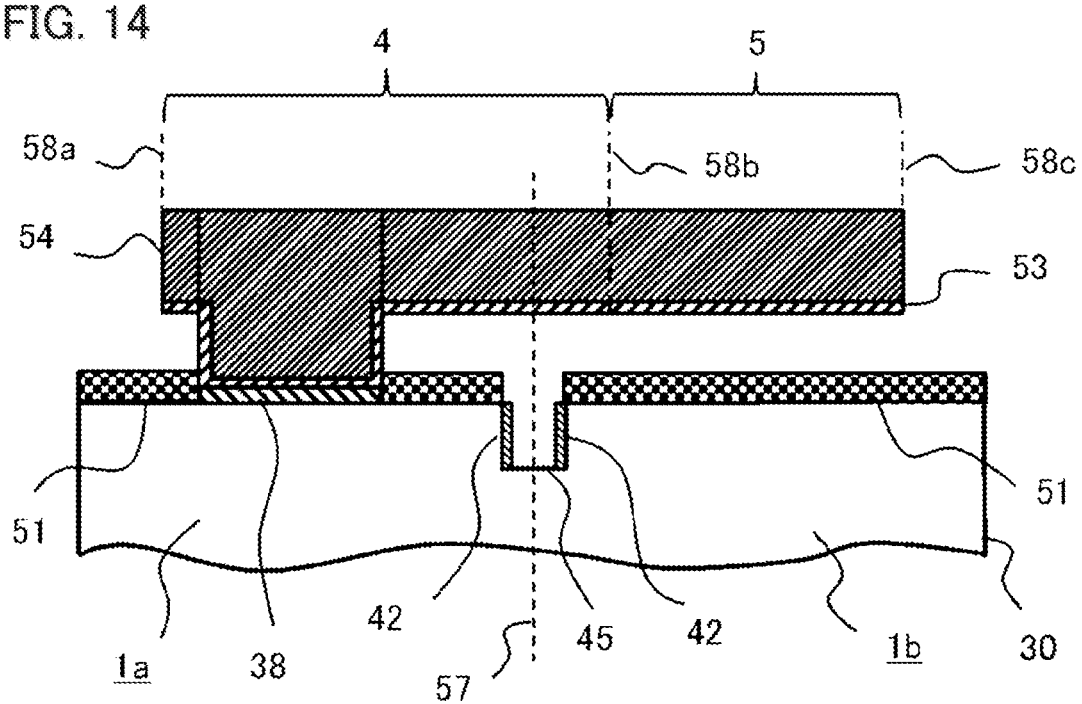
FIG. 14 is a diagram for explaining a forming step of the extended wire patterns according to Embodiment 1.

In the second resist pattern removing step being the fifth step of the extended wire pattern forming step, the resist pattern 52*b* formed on the front surface of the first metal layer 53 is removed as shown in FIG. 12. In the first metal layer forming step being the sixth step of the extended wire pattern forming step, the first metal layer 53 is removed by ion milling or the like as shown in FIG. 13. In the first resist pattern removing step being the seventh step of the extended wire pattern forming step, the resist pattern 52a formed on the front surface of the passivation layer 51 and in the chip separation groove 45 is removed as shown in FIG. 14. By the extended wire pattern forming step, it is possible to form a structure in which at least the extended wire pattern 3 outside the region of one chip is not in contact with and floats above the passivation layer 51 of the other chip as shown in FIG. 14.

Note that the steps in the method for producing the optical module 100 excluding the high-frequency substrate connection step, namely the optical element forming step, the extended wire pattern forming step, the chip separation step, and the front end face film forming step each are a step in the method for producing the optical semiconductor device 90. Therefore, in the method for producing the optical module 100, the high-frequency substrate connection step is performed after the method for producing the optical semiconductor device 90 is performed.

Since the optical semiconductor device 90 according to Embodiment 1 includes the extended wire pattern 3 that is connected to the front surface electrodes (cathode electrode 38 and anode electrode 39b) of the optical semiconductor chip 1 and that extends outside the outer periphery of the optical semiconductor chip 1, unlike the wire connection in which a loop is generated in the connection to the high-frequency substrate 2, the extended wire pattern 3 makes it possible for the optical semiconductor device to connect to the high-frequency substrate through a path shorter than the wire connection. Since the optical semiconductor device 90 of Embodiment 1 can be connected to the high-frequency substrate through the path shorter than the wire connection, reflection of a signal for driving the optical semiconductor device 90 can be minimized, and thus the high-frequency characteristics of the optical semiconductor device 90 can be improved. Since the optical semiconductor device 90 of Embodiment 1 includes the extended wire pattern 3 connected to the front surface electrodes (cathode electrode 38 and anode electrode 39b) of the optical semiconductor chip 1 and extends outside the outer periphery of the optical semiconductor chip 1, it can be connected to the high-frequency substrate 2 through the path shorter than the wire connection without using the flip-chip mounting method.

Since the optical module 100 of Embodiment 1 includes the optical semiconductor device 90, unlike the wire connection in which the loop is generated in the connection to the high-frequency substrate 2, the extended wire pattern 3 makes it possible for the optical semiconductor device to connect to the high-frequency substrate through the path shorter than the wire connection. Since the optical module 100 of Embodiment 1 can be connected to the high-frequency substrate through the path shorter than the wire connection, reflection of a signal for driving the optical semiconductor device 90 can be minimized, and thus the high-frequency characteristics of the optical semiconductor device 90 and the optical module 100 can be improved. Since, in the optical module 100 of Embodiment 1, the optical semiconductor device 90 includes the extended wire pattern 3 that is connected to the front surface electrodes (cathode electrode 38 and anode electrode 39b) of the optical semiconductor chip 1 and that extends outside the outer periphery of the optical semiconductor chip 1, the optical semiconductor device 90 can be connected to the high-frequency substrate 2 through the path shorter than the wire connection without using the flip-chip mounting method.

Figure 15:
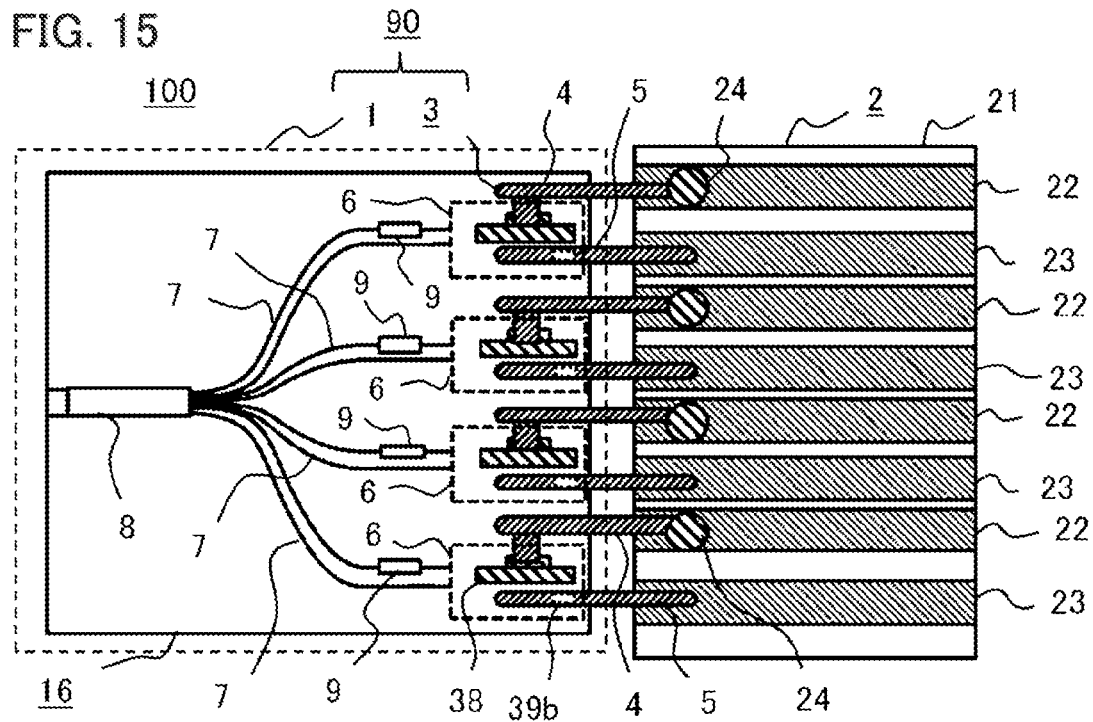
FIG. 15 is a diagram showing another optical semiconductor device and another optical module according to Embodiment 1.

The optical semiconductor chip 1 is not limited to the integrated semiconductor laser chip 15 shown in FIG. 1, and may be another integrated semiconductor laser chip. FIG. 15 is a diagram showing another optical semiconductor device and another optical module according to Embodiment 1. The optical semiconductor chip 1 shown in FIG. 15 is an integrated semiconductor chip 16 in which four semiconductor lasers 6 are integrated and a monitor light receiving element 9 for monitoring the output of the laser light is disposed in the waveguide 7. The integrated semiconductor laser chip 16 is different from the integrated semiconductor laser chip 15 in that the monitor light receiving element 9 is disposed in the waveguide 7. The monitor light receiving element 9 may be monolithically formed on the front surface of the waveguide 7, or a light receiving element fabricated in advance may be bonded with an adhesive. In the integrated semiconductor laser chip 16, since the monitor light receiving element 9 is disposed in the waveguide 7, the output of the laser light of each semiconductor laser 6 can be monitored.

Although, as shown in FIG. 14, the example of the structure is shown in which the extended wire pattern 3 before the chip separation is not in contact with and floats above the passivation layers 51 that is in the region of one chip and in the adjacent other chip, the example is not a limitation. As described above, the extended wire pattern 3 before the chip separation needs to have a structure that is not in contact with and floats above the passivation layer 51 of the adjacent other chip at least in the region outside the one chip. That is, in the optical semiconductor chip 1a of FIG. 14, the extended wire pattern 3 (extended wires 4 and 5) may be formed so as to be in contact with the passivation layer 51. Also in this case, since the resist pattern 52a is formed so as to cover the chip separation groove 45, in the optical semiconductor chip 1b adjacent to the optical semiconductor chip 1a via the chip separation groove 45, the extended wire pattern 3 connected to the front surface electrodes (cathode electrode 38 and anode electrode 39b) of the optical semiconductor chip 1a can be formed to be the structure that is not in contact with and floats above the passivation layer 51 of the optical semiconductor chip 1b.

As described above, the optical semiconductor device 90 of Embodiment 1 is an optical semiconductor device that includes the optical semiconductor chip 1 in which at least one optical element (semiconductor lasers 6) is formed in the semiconductor substrate (InP substrate 30), and the extended wire pattern 3 that is connected to the first electrode (cathode electrode 38) and the second electrode (anode electrode 39b) of the optical element (semiconductor laser 6) and that extends outside the optical semiconductor chip 1. The first electrode (cathode electrode 38) and the second electrode (anode electrode 39b) are formed on the front surface side of the optical semiconductor chip 1, and the extended wire pattern 3 is disposed on the front surface of the optical semiconductor chip 1 or at a position apart from the front surface. Since the optical semiconductor device 90 of Embodiment 1 includes the extended wire pattern 3 that is connected to the first electrode (cathode electrode 38) and the second electrode (anode electrode 39b) of the optical element (semiconductor laser 6) and that extends outward from the optical semiconductor chip 1, when connected to the high-frequency substrate 2, the optical semiconductor device 90 can be connected to the high-frequency substrate 2 through the path shorter than the wire connection without using the flip-chip mounting method.

The optical module 100 of Embodiment 1 includes the optical semiconductor device 90 and the high-frequency substrate 2 connected to the extended wire pattern 3. The optical semiconductor device 90 is an optical semiconductor device that includes the optical semiconductor chip 1 in which at least one optical element (semiconductor lasers 6) is formed in the semiconductor substrate (InP substrate 30), and the extended wire pattern 3 that is connected to the first electrode (cathode electrode 38) and the second electrode (anode electrode 39b) of the optical element (semiconductor laser 6) and that extends outside the optical semiconductor chip 1. The first electrode (cathode electrode 38) and the second electrode (anode electrode 39b) are formed on the front surface side of the optical semiconductor chip 1, and the extended wire pattern 3 is disposed on the front surface of the optical semiconductor chip 1 or at a position apart from the front surface. In the optical module 100 of Embodiment 1, the optical semiconductor device 90 includes the extended wire patterns 3 that is connected to the first electrode (cathode electrode 38) and the second electrode (anode electrode 39b) of the optical element (semiconductor laser 6) and that extends outside the optical semiconductor chip 1, it can be connected to the high-frequency substrate 2 through the path shorter than the wire connection without using the flip-chip mounting method.

A method for producing optical semiconductor device of Embodiment 1 is a method for producing optical semiconductor device for producing an optical semiconductor device 90 including: the optical semiconductor chip 1 in which at least one optical element (semiconductor laser 6) is formed in the semiconductor substrate (InP substrate 30); and the extended wire pattern 3 that is connected to the first electrode (cathode electrode 38) and the second electrode (anode electrode 39b) of the optical element (semiconductor laser 6) and that extends outside the optical semiconductor chip 1. The method for producing the optical semiconductor device of Embodiment 1 includes the optical element forming step and the extended wire pattern forming step, the optical element forming step being the step of forming the optical element (semiconductor laser 6) in which the first electrode (cathode electrode 38) and the second electrode (anode electrode 39b) are disposed on the front surface side of the optical semiconductor chip 1 and in which the passivation layer 51 having the openings to expose a part of the first electrode (cathode electrode 38) and a part of the second electrode (anode electrode 39b) is formed, the extended wire pattern forming step being the step in which the extended wire pattern 3 is formed on the front surface of the passivation layer 51 or at a position apart from the front surface of the passivation layer 51. In the method for producing the optical semiconductor device of Embodiment 1, the optical semiconductor device 90 including the extended wire pattern 3 that extends outside the optical semiconductor chip 1 can be produced. Therefore the optical semiconductor device 90 that can be connected to the high-frequency substrate 2 through the path shorter than the wire connection without using the flip-chip mounting method when connected to the high-frequency substrate 2 can be produced.

Embodiment 2

Figure 16:
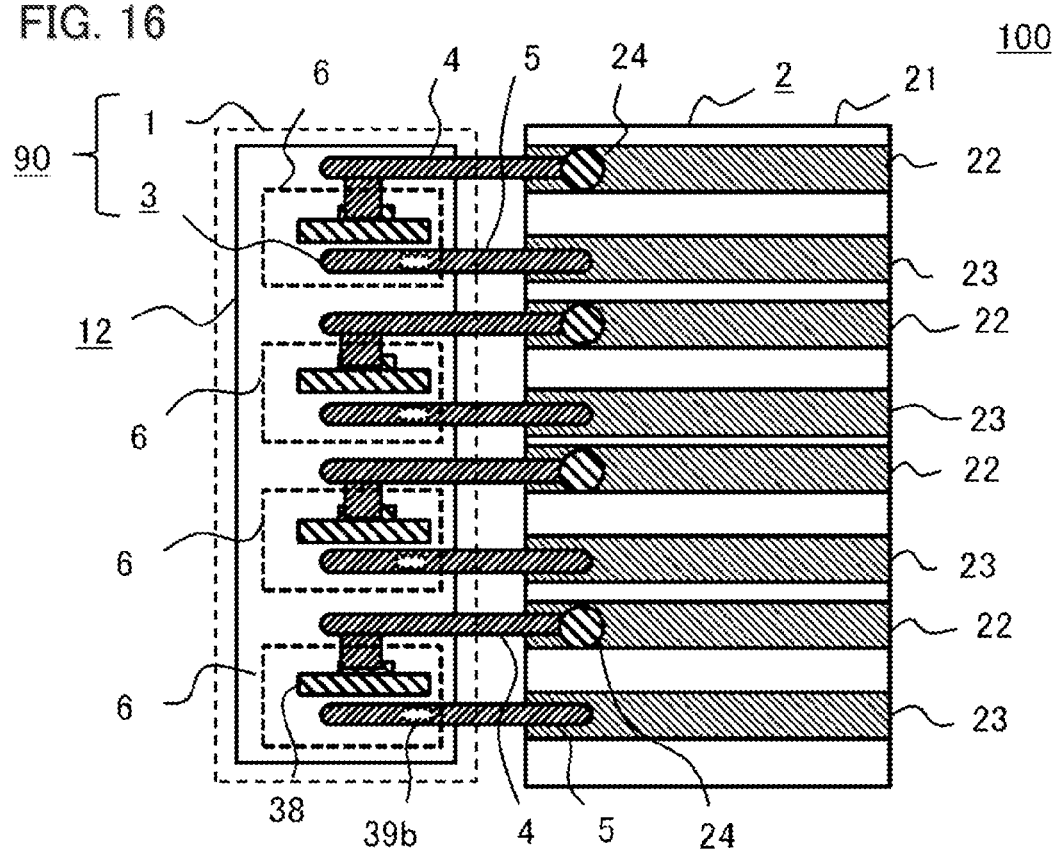
FIG. 16 is a diagram showing an optical semiconductor device and an optical module according to Embodiment 2.
Figure 17:
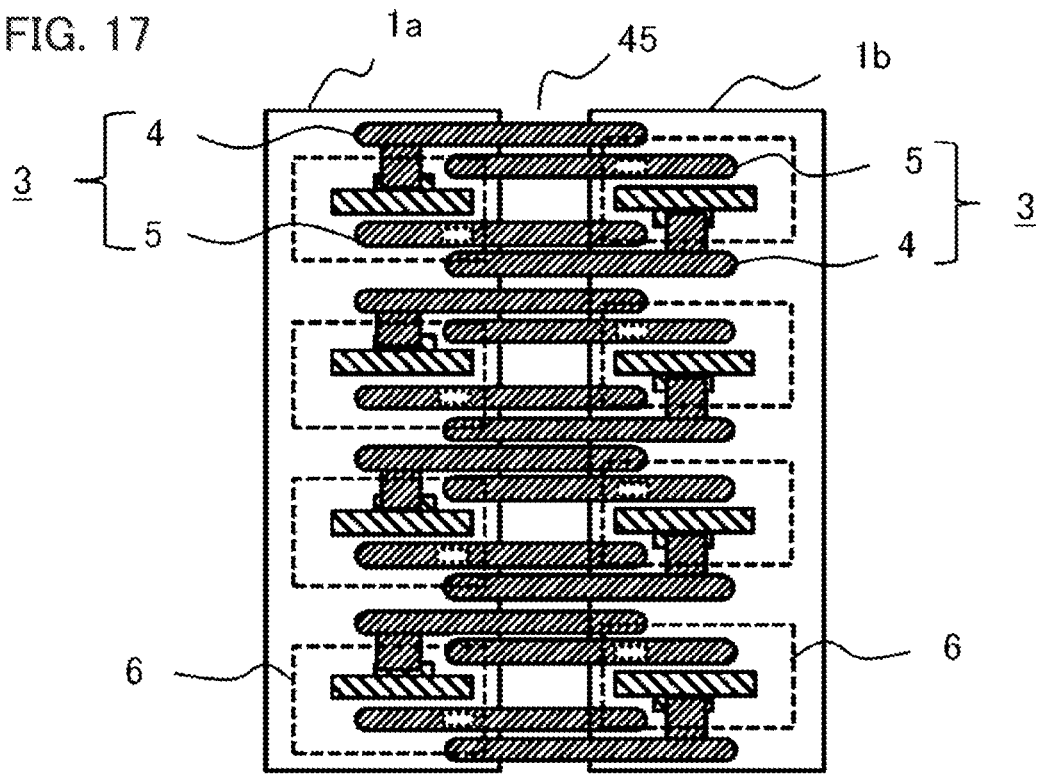
FIG. 17 is a diagram showing two optical semiconductor chips and extended wire patterns before chip separation according to Embodiment 2.

In Embodiment 1, the optical semiconductor chip 1 is exemplified as the optical semiconductor chip 1 in which four semiconductor lasers 6, the waveguides 7, and the spot-size converter 8 are integrated, but the optical semiconductor chip 1 may be an integrated semiconductor laser chip 12 in which only a plurality of semiconductor lasers 6 are integrated. FIG. 16 is a diagram showing an optical semiconductor device and an optical module according to Embodiment 2, and FIG. 17 is a diagram showing two optical semiconductor chips and extended wire patterns before separation according to Embodiment 2. FIG. 17 is a diagram corresponding to FIG. 5 of Embodiment 1. Note that, in FIG. 17, an optical semiconductor chip 1b is formed in the semiconductor substrate (InP substrate 30) with the arrangement in which an optical semiconductor chip 1a is rotated by 180°. In the optical semiconductor chips 1a and 1b, the unshown scribe lines 47 are formed on the outer periphery that is not in contact with the chip separation groove 45. A plurality of basic arrangements of the optical semiconductor chips 1a and 1b are made in the semiconductor substrate via the scribe lines 47.

The optical semiconductor device 90 of Embodiment 2 is different from the optical semiconductor device 90 of Embodiment 1 in that the optical semiconductor chip 1 is the integrated semiconductor laser chip 12 in which only the plurality of semiconductor lasers 6 are integrated. FIG. 16 shows an example in which the optical semiconductor chip 1 is the integrated semiconductor laser chip 12 in which four semiconductor lasers 6 are integrated. The optical module 100 of Embodiment 2 is different from the optical module 100 of Embodiment 1 in that the optical semiconductor chip 1 is the integrated semiconductor laser chip 12. A method for producing the optical semiconductor device 90 and the optical module 100 in Embodiment 2 is the same as the method for producing the optical semiconductor device 90 and the optical module 100 in Embodiment 1.

In the optical semiconductor device 90 of Embodiment 2, since the extended wire pattern 3 has the same structure as that of Embodiment 1, the same function and effect as those of the optical semiconductor device 90 of Embodiment 1 are obtained. In the optical module 100 of Embodiment 2, since the extended wire pattern 3 has the same structure as that of Embodiment 1, the same function and effect as those of the optical module 100 of Embodiment 1 are obtained. The optical semiconductor device 90 of Embodiment 2 includes the extended wire pattern 3 that is connected to the front surface electrodes (cathode electrode 38 and anode electrode 39b) of the optical semiconductor chip 1 and that extends outside the outer periphery of the optical semiconductor chip 1, and thus it can be connected to the high-frequency substrate 2 through a path shorter than the wire connection. Since the optical module 100 of Embodiment 2 includes the optical semiconductor device 90 of Embodiment 2, it can be connected to the high-frequency substrate 2 through the path shorter than the wire connection.

Embodiment 3

Figure 18:
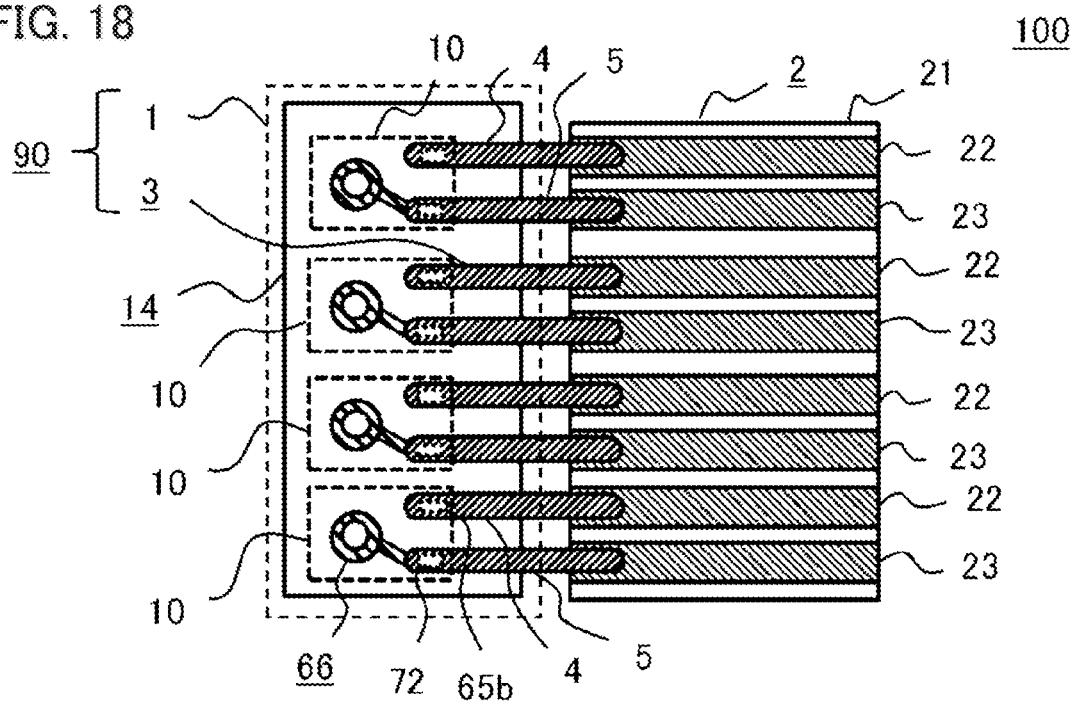
FIG. 18 is a diagram showing an optical semiconductor device and an optical module according to Embodiment 3.
Figure 19:
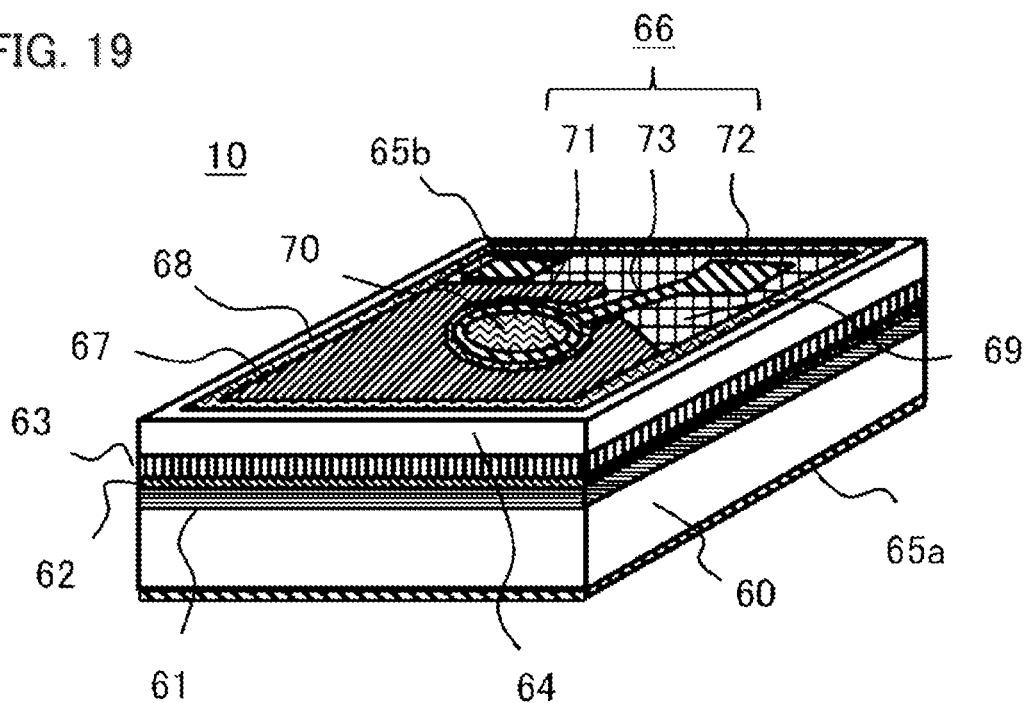
FIG. 19 is a diagram showing a light receiving element of FIG. 18.
Figure 20:
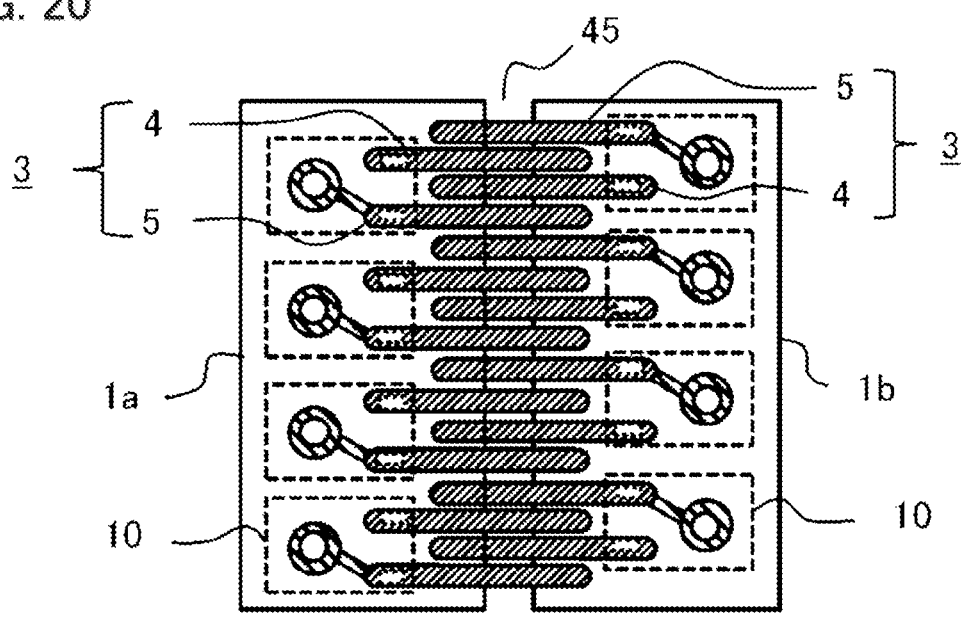
FIG. 20 is a diagram showing two optical semiconductor chips and extended wire patterns before chip separation according to Embodiment 3.

In Embodiment 1, the optical semiconductor chip 1 is exemplified as the optical semiconductor chip 1 in which the four semiconductor lasers 6 are integrated, but the optical semiconductor chip 1 may be an integrated light receiving element chip 14 in which light receiving elements 10 are integrated. FIG. 18 is a diagram showing an optical semiconductor device and an optical module according to Embodiment 3, and FIG. 19 is a diagram showing the light receiving element of FIG. 18. FIG. 20 is a diagram showing two optical semiconductor chips and extended wire patterns before separation according to Embodiment 3. The optical semiconductor device 90 of Embodiment 3 is different from the optical semiconductor device 90 of Embodiment 1 in that the optical semiconductor chip 1 is the integrated light receiving element chip 14 in which a plurality of the light receiving elements 10 are integrated. FIG. 18 shows an example in which the optical semiconductor chip 1 is the integrated light receiving element chip 14 in which four light receiving elements 10 are integrated. The optical module 100 of Embodiment 3 is different from the optical module 100 of Embodiment 1 in that the optical semiconductor chip 1 is the integrated light receiving element chip 14.

The light receiving element 10 is, for example, an avalanche photodiode. The light receiving element 10 is provided on an n-type InP substrate 60 with a multilayer reflection layer 61, a multiplication layer 62, a light absorbing layer 63, a window layer 64, an anode electrode 66 having a ring-shaped electrode part 71 that is formed on the front surface of the window layer 64 and that surrounds the light receiving part 70, a surface protective film 68 formed on the front surface of the window layer 64 other than the ring-shaped electrode part 71 and the outer periphery of the light receiving element 10, a light shielding metal 67 formed on the front surface of the surface protective film 68 to surround the outer periphery of the ring-shaped electrode part 71, an insulating film 69 formed on the front surface of the surface protective film 68, a cathode electrode 65a formed on the rear surface of the InP substrate 60, and a cathode electrode 65b formed on the front surface of the insulating film 69. The anode electrode 66 has a pad portion 72 connected to the ring-shaped electrode part 71 through a connection portion 73. The pad portion 72 of the anode electrode 66 is connected to the extended wire 5. The pad portion 72 and the connection portion 73 of the anode electrode 66 are formed on the front surface of the insulating film 69. The cathode electrode 65a and the cathode electrode 65b are connected to each other. The front surface of the light receiving part 70 surrounded by the ring-shaped electrode part 71 is the front surface of the surface protective film 68. On the front surface of the integrated light receiving element chip 14, a passivation layer 51 is formed, but the passivation layer 51 is omitted in FIG. 19.

As described in Embodiment 1, the extended wire pattern 3 has a structure in which the extended wire pattern 3 outside the region of one chip is not in contact with and floats above the passivation layer 51 of the other chip. The extended wire pattern 3 includes the extended wire 4 connected to the cathode electrode 65b of the light receiving element 10 through an opening of the passivation layer 51 and the extended wire 5 connected to the pad portion 72 of the anode electrode 66 of the light receiving element 10 through an opening of the passivation layer 51. The cathode electrode 65b and the pad portion 72 of the anode electrode 66 in the light receiving element 10 are disposed on one end side of the light receiving element 10. FIG. 18 shows an example in which the cathode electrode 65b and the pad portion 72 of the anode electrode 66 are disposed close to one of the short sides of the light receiving element 10. An end of the light receiving element 10 on the side where the cathode electrode 65b and the pad portion 72 of the anode electrode 66 are disposed will be referred to as an electrode arrangement end. The extended wire pattern 3 extends outside the electrode arrangement end. Note that one end of an adjacent optical semiconductor chip 1 facing the electrode arrangement end is the electrode arrangement end. Since the extended wire pattern 3 extends outside from the electrode arrangement end being one end of the optical semiconductor chip 1, the electrode arrangement end is also the extended wire arrangement end. In FIGS. 18 and 20, for easy understanding, the cathode electrode 65b and the pad portion 72 of the anode electrode 66 are shown by broken line rectangles in white. The integrated light receiving element chip 14 is provided with four light receiving elements 10, thereby including a total of eight extended wires 4 and 5.

The extended wires 4 and 5 as the extended wire pattern 3 of the semiconductor chip 1 are connected to the metal lines 22 and 23 of the high-frequency substrate 2 by thermo-compression bonding. The other ends of the metal lines 22 and 23 to which the extended wires 4 and 5 are not connected are connected with unshown gold wires or the like, to an external device on which a circuit for processing high-frequency photo-detection current generated through the photo-detection by the light receiving element 10 is mounted. In the metal lines 22 and 23 of the high frequency substrate 2, the high-frequency photo-detection current generated by the light receiving element 10 flows. For example, when each light receiving element 10 receives an optical signal of 25 Gbps, the high-frequency photo-detection current of up to 25 GHz flows through the metal lines 22 and 23 of the high-frequency substrate 2. Unlike FIG. 1, FIG. 18 shows an example in which the gold balls 24 are not formed on the front surfaces of the extended wires 4 and 5, that is, the surfaces opposite to the surfaces facing the front surfaces of the metal lines 22 and 23 on the high-frequency substrate 2.

With reference to FIG. 20, the arrangement of the two optical semiconductor chips 1a and 1b and the extended wire patterns 3 before separation will be described. FIG. 20 shows a diagram corresponding to FIG. 5 in Embodiment 1. The optical semiconductor chips 1a and 1b are arranged so that their electrode arrangement ends face each other across the chip separation groove 45. The extended wires 4 and 5 as the extended wire pattern 3 of the optical semiconductor chip 1a extend beyond the chip separation groove 45 to the optical semiconductor chip 1b. The extended wires 4 and 5 as the extended wire pattern 3 of the optical semiconductor chip 1b extend beyond the chip separation groove 45 to the optical semiconductor chip 1a. The optical semiconductor chip 1b is formed in the semiconductor substrate (InP substrate 60) with the arrangement in which the optical semiconductor chip 1a is rotated by 180°. Note that, in FIG. 20, the unshown scribe lines 47 (refer to FIG. 5) are formed on the outer periphery that are not in contact with the chip separation groove 45 in the optical semiconductor chips 1a and 1b. A plurality of basic arrangements of the optical semiconductor chips 1a and 1b are made in the semiconductor substrate via scribe lines 47.

A method for producing the optical semiconductor device 90 and the optical module 100 in Embodiment 3 is basically the same as the method for producing the optical semiconductor device 90 and the optical module 100 in Embodiment 1. In the method for producing the optical semiconductor device 90 and the optical module 100 of Embodiment 3, although the structure of the light receiving element 10 being the optical element of the optical semiconductor chip 1 formed in the layer below the passivation layer 51 is different from the structure of the semiconductor laser 6, the method of forming the extended wire pattern 3 is the same. The steps in the method for producing the optical semiconductor device 90 and the optical module 100 of Embodiment 3 different from those in Embodiment 1 will be described. Unlike the semiconductor laser 6, the light receiving element 10 does not require coating of optical material films on the laser rear end face 46 and the front end face. Thus, in the optical element forming step, the passivation layer forming step, the separation groove forming step, and the front surface electrode exposure step are performed. That is, the rear end face reflection film forming step of Embodiment 1 is not performed. After the optical element forming step, the extended wire pattern forming step, the chip separation step, and the high-frequency substrate connection step are performed. That is, the front end face film forming step of Embodiment 1 is not performed. Note that, in the integrated light receiving element chip 14, since the side surface of the chip separation groove 45 is not coated with the high reflection film 42, the depth of the chip separation groove 45 may be such that the chip separation can be performed without damaging the extended wire pattern 3 in the chip separation step. Depending on a dicing apparatus, the chip separation groove 45 may be replaced with the scribe line 47. In this case, the separation groove forming step is unnecessary and the optical element forming step can be shortened.

In the optical semiconductor device 90 of Embodiment 3, since the extended wire pattern 3 has the same structure as that of Embodiment 1, the same function and effect as those of the optical semiconductor device 90 of Embodiment 1 are obtained. In the optical module 100 of Embodiment 3, since the extended wire pattern 3 has the same structure as that of Embodiment 1, the same function and effect as those of the optical module 100 of Embodiment 1 are obtained. The optical semiconductor device 90 of Embodiment 3 includes the extended wire pattern 3 that is connected to the front surface electrodes (cathode electrode 65*b* and pad portion 72 of anode electrode 66) of the optical semiconductor chip 1 and that extends outside the outer periphery of the optical semiconductor chip 1, and thus it can be connected to the high-frequency substrate 2 through a path shorter than the wire connection. Since the optical module 100 of Embodiment 3 includes the optical semiconductor device 90 of Embodiment 3, it can be connected to the high-frequency substrate 2 through the path shorter than the wire connection.

Embodiment 4

Figure 21:
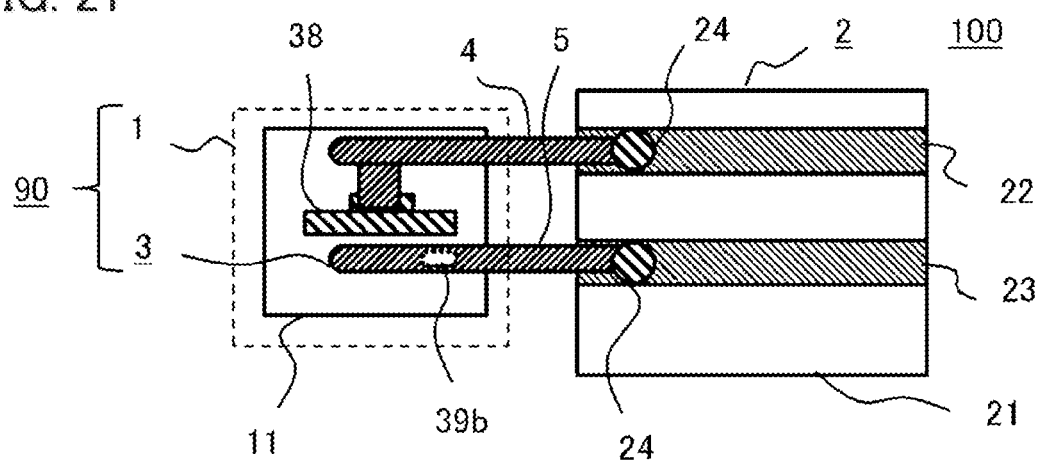
FIG. 21 is a diagram showing an optical semiconductor device and an optical module according to Embodiment 4.
Figure 22:
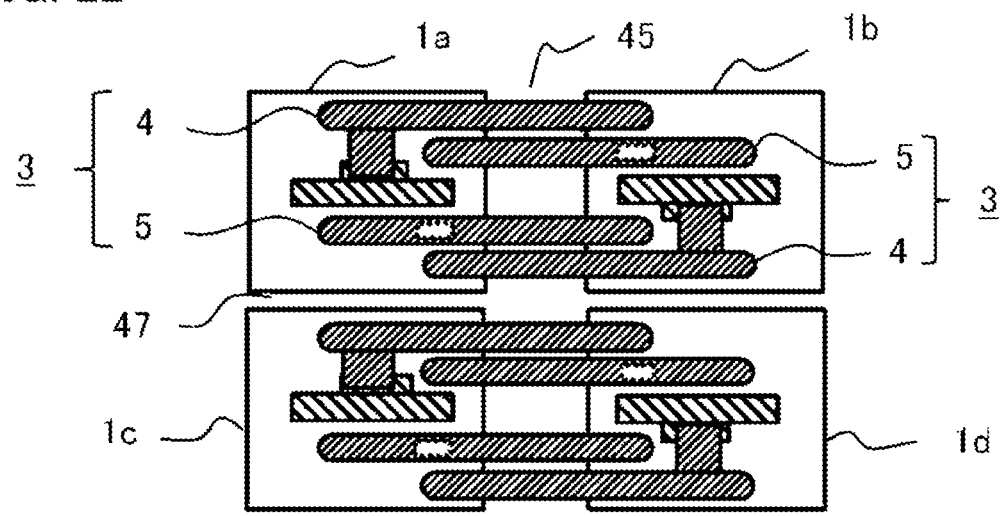
FIG. 22 is a diagram showing four optical semiconductor chips and extended wire patterns before chip separation according to Embodiment 4.

FIG. 21 is a diagram showing an optical semiconductor device and an optical module according to Embodiment 4, and FIG. 22 is a diagram showing four optical semiconductor chips and extended wire patterns before separation according to Embodiment 4. FIG. 22 shows a diagram corresponding to FIG. 5 in Embodiment 1. The optical semiconductor chip 1 of Embodiment 4 is a semiconductor laser chip 11 in which one semiconductor laser 6 is formed on a semiconductor substrate (InP substrate 30). The optical semiconductor device 90 of Embodiment 4 is different from the optical semiconductor device 90 of Embodiment 1 in that the optical semiconductor chip 1 is the semiconductor laser chip 11 in which only one semiconductor laser 6 is formed. The optical module 100 of Embodiment 4 is different from the optical module 100 of Embodiment 1 in that the optical semiconductor chip 1 is the semiconductor laser chip 11. A method for producing the optical semiconductor device 90 and the optical module 100 in Embodiment 4 is the same as the method for producing the optical semiconductor device 90 and the optical module 100 in Embodiment 1.

The extended wires 4 and 5 as the extended wire pattern 3 of the semiconductor chip 1 are connected to the metal lines 22 and 23 of the high-frequency substrate 2 by thermocompression bonding. FIG. 21 shows an example in which the two metal lines 22 and 23 are disposed on the high-frequency substrate 2. FIG. 21 shows an example in which gold balls 24 are formed on the front surfaces of the extended wires 4 and 5, that is, the surfaces opposite to the surfaces facing the front surfaces of the metal lines 22 and 23 on the high-frequency substrate 2. FIG. 22 shows four optical semiconductor chips 1*a*, 1*b*, 1*c*, and 1*d* before the separation. The optical semiconductor chip 1*b* is formed in the semiconductor substrate (InP substrate 30) with the arrangement in which the optical semiconductor chip 1*a* is rotated by 180°. The optical semiconductor chips 1*c* and 1*d* are formed with the optical semiconductor chips 1*a* and 1*b* moved in parallel across the scribe line 47. Note that, in FIG. 22, the unshown scribe lines 47 are also formed on the outer periphery that are neither in contact with the chip separation groove 45 or the scribe line 47 separating the optical semiconductor chip 1*c*, in the optical semiconductor chips 1*a*. Similarly in the optical semiconductor chips 1*b*, 1*c*, and 1*d*, the unshown scribe lines 47 are also formed in the outer peripheries that are neither in contact with the chip separation groove 45 or the scribe line 47 separating adjacent other optical semiconductor chips 1. A plurality of basic arrangements of the optical semiconductor chips 1*a* and 1*b* are made in the semiconductor substrate via scribe lines 47.

In the optical semiconductor device 90 of Embodiment 4, since the extended wire pattern 3 has the same structure as that of Embodiment 1, the same function and effect as those of the optical semiconductor device 90 of Embodiment 1 are obtained. In the optical module 100 of Embodiment 4, since the extended wire pattern 3 has the same structure as that of Embodiment 1, the same function and effect as those of the optical module 100 of Embodiment 1 are obtained. The optical semiconductor device 90 of Embodiment 4 includes the extended wire pattern 3 that is connected to the front surface electrodes (cathode electrode 38 and anode electrode 39*b*) of the optical semiconductor chip 1 and that extends outside the outer periphery of the optical semiconductor chip 1, and thus it can be connected to the high-frequency substrate 2 through a path shorter than the wire connection. Since the optical module 100 of Embodiment 4 includes the optical semiconductor device 90 of Embodiment 4, it can be connected to the high-frequency substrate 2 through the path shorter than the wire connection.

Embodiment 5

Figure 23:
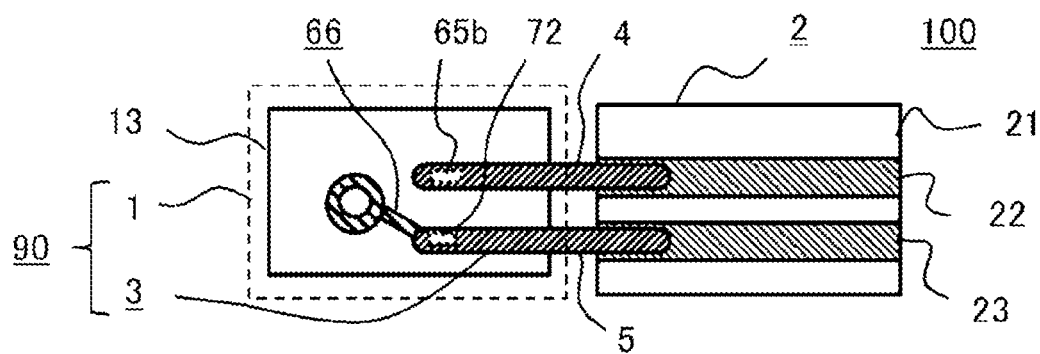
FIG. 23 is a diagram showing an optical semiconductor device and an optical module according to Embodiment 5.
Figure 24:
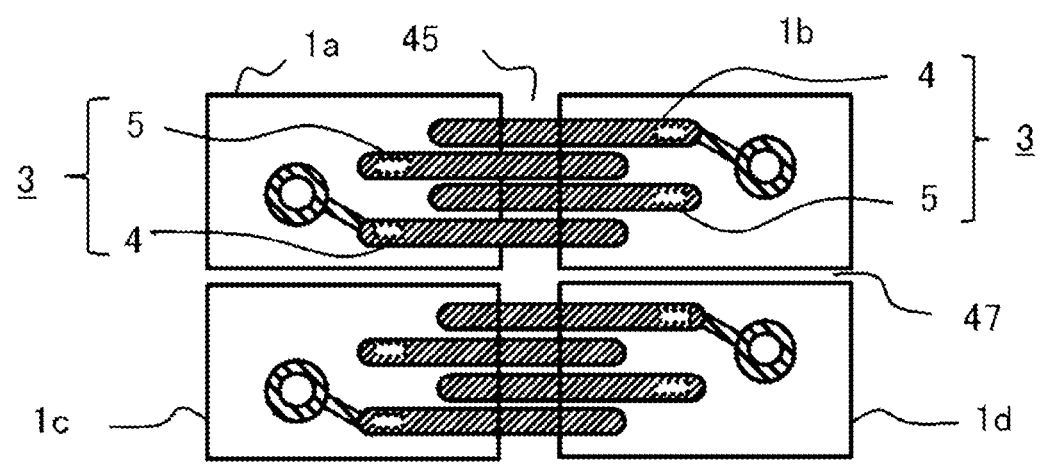
FIG. 24 is a diagram showing four optical semiconductor chips and extended wire patterns before chip separation according to Embodiment 5.

FIG. 23 is a diagram showing an optical semiconductor device and an optical module according to Embodiment 5, and FIG. 24 is a diagram showing four optical semiconductor chips and an extended wire patterns before separation according to Embodiment 5. FIG. 24 shows a diagram corresponding to FIG. 5 in Embodiment 1 and FIG. 20 in Embodiment 3. The optical semiconductor chip 1 of Embodiment 5 is a light receiving element chip 13 in which one light receiving element 10 is formed on a semiconductor substrate (InP substrate 60). The optical semiconductor device 90 of Embodiment 5 is different from the optical semiconductor device 90 of Embodiment 3 in that the optical semiconductor chip 1 is the light receiving element chip 13 in which only one light receiving element 10 is formed. The optical module 100 of Embodiment 5 is different from the optical module 100 of Embodiment 3 in that the optical semiconductor chip 1 is the light receiving element chip 13. A method for producing the optical semiconductor device 90 and the optical module 100 in Embodiment 5 is the same as the method for producing the optical semiconductor device 90 and the optical module 100 in Embodiment 3.

The extended wires 4 and 5 as the extended wire pattern 3 of the semiconductor chip 1 are connected to the metal lines 22 and 23 of the high-frequency substrate 2 by thermocompression bonding. FIG. 23 shows an example in which the two metal lines 22 and 23 are disposed on the high-frequency substrate 2. FIG. 23 shows an example in which the gold balls 24 are not formed on the front surfaces of the extended wires 4 and 5, that is, the surfaces opposite to the surfaces facing the front surfaces of the metal lines 22 and 23 on the high-frequency substrate 2. FIG. 24 shows four optical semiconductor chips 1a, 1b, 1c, and 1d before the separation. The optical semiconductor chip 1b is formed in the semiconductor substrate (InP substrate 60) with the arrangement in which the optical semiconductor chip 1a is rotated by 180°. The optical semiconductor chips 1c and 1d are formed with the optical semiconductor chips 1a and 1b moved in parallel across the scribe line 47. Note that, in FIG. 24, the unshown scribe lines 47 are also formed on the outer periphery that are neither in contact with the chip separation groove 45 or the scribe line 47 separating the optical semiconductor chip 1c, in the optical semiconductor chips 1a. Similarly, in the optical semiconductor chips 1b, 1c, and 1d, the unshown scribe lines 47 are also formed in the outer peripheries that are neither in contact with the chip separation groove 45 or the scribe line 47 separating adjacent other optical semiconductor chips 1. A plurality of basic arrangements of the optical semiconductor chips 1a and 1b are made in the semiconductor substrate via scribe lines 47.

In the optical semiconductor device 90 of Embodiment 5, since the extended wire pattern 3 has the same structure as that of Embodiment 3, the same function and effect as those of the optical semiconductor device 90 of Embodiment 3 are obtained. In the optical module 100 of Embodiment 5, since the extended wire pattern 3 has the same structure as that of Embodiment 3, the same function and effect as those of the optical module 100 of Embodiment 3 are obtained. The optical semiconductor device 90 of Embodiment 5 includes the extended wire pattern 3 that is connected to the front surface electrodes (cathode electrode 65b and pad portion 72 of anode electrode 66) of the optical semiconductor chip 1 and that extends outside the outer periphery of the optical semiconductor chip 1, and thus it can be connected to the high-frequency substrate 2 through a path shorter than the wire connection. Since the optical module 100 of Embodiment 5 includes the optical semiconductor device 90 of Embodiment 5, it can be connected to the high-frequency substrate 2 through the path shorter than the wire connection.

Note that, although various exemplary embodiments and examples are described in the present application, various features, aspects, and functions described in one or more embodiments are not inherent in a particular embodiment, and can be applicable alone or in their various combinations to each embodiment. Accordingly countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS 1, 1a, 1b, 1c, 1d, 1e, 1f: optical semiconductor chip, 2: high-frequency substrate, 3: extended wire pattern, 4: extended wire (first extended wire), 5: extended wire (second extended wire), 6: semiconductor laser, 7: waveguide, 8: spot-size converter, 10: light receiving element, 30: InP substrate (semiconductor substrate), 38: cathode electrode (first electrode), 39b: anode electrode (second electrode), 42: high reflection film, 45: chip separation groove, 46: laser rear end face, 51: passivation layer, 53: first metal layer, 54: second metal layer, 60: InP substrate (semiconductor substrate), 65b: cathode electrode (first electrode), 66: anode electrode (second electrode), 90, 90a, 90b: optical semiconductor device, 100: optical module

The invention claimed is:

1. A method for producing optical semiconductor device for producing an optical semiconductor device that is provided with one optical semiconductor chip in which at least one optical element is formed in a semiconductor substrate and that is provided with an extended wire pattern that is connected to a first electrode and a second electrode of the optical element and that extends outside the optical semiconductor chip, the method comprising:
  an optical element forming step; and
  an extended wire pattern forming step,
  the optical element forming step being a step of forming the optical element in which the first electrode and the second electrode are disposed on a front surface side of the optical semiconductor chip and in which a passivation layer having openings to expose a part of the first electrode and a part of the second electrode is formed,
  the extended wire pattern forming step being a step in which the extended wire pattern is formed on a front surface of the passivation layer or at a position apart from the front surface of the passivation layer, and
  wherein the extended wire pattern extends outside only from one end side of the optical semiconductor chip;
  in the optical element forming step, a plurality of chip regions in which the optical semiconductor chips are formed are arranged on the semiconductor substrate; and
  in at least two chip regions adjacent to each other, the optical elements are formed such that extended wire arrangement ends each being one end of the optical semiconductor chip in which the extended wire pattern extends outward face each other.

2. The method for producing optical semiconductor device according to claim 1, wherein the optical element forming step includes a separation groove forming step in which a chip separation groove is formed by dry etching between the chip regions where the extended wire arrangement ends are adjacent to each other.

3. The method for producing optical semiconductor device according to claim 2, wherein in the extended wire pattern forming step, the extended wire pattern of the optical semiconductor chip formed in one chip region is formed to extend beyond the chip separation groove to the optical semiconductor chip formed in another adjacent chip region.

4. The method for producing optical semiconductor device according to claim 3, wherein
  the optical semiconductor chip is provided with a semiconductor laser formed as the optical element;
  a rear end face of the semiconductor laser opposite to a laser light emission side is a side face of the chip separation groove formed in the separation groove forming step; and
  the optical element forming step includes a rear end face reflection film forming step in which the rear end face of the semiconductor laser is coated with a reflection film for reflecting the laser light after the separating groove forming step.

5. The method for producing optical semiconductor device according to claim 2, wherein
the optical semiconductor chip is provided with a semiconductor laser formed as the optical element;
a rear end face of the semiconductor laser opposite to a laser light emission side is a side face of the chip separation groove formed in the separation groove forming step; and
the optical element forming step includes a rear end face reflection film forming step in which the rear end face of the semiconductor laser is coated with a reflection film for reflecting the laser light after the separating groove forming step.

6. A method for producing optical semiconductor device for producing an optical semiconductor device that is provided with one optical semiconductor chip in which at least one optical element is formed in a semiconductor substrate and that is provided with an extended wire pattern that is connected to a first electrode and a second electrode of the optical element and that extends outside the optical semiconductor chip, the method comprising:
an optical element forming step; and
an extended wire pattern forming step,
the optical element forming step being a step of forming the optical element in which the first electrode and the second electrode are disposed on a front surface side of the optical semiconductor chip and in which a passivation layer having openings to expose a part of the first electrode and a part of the second electrode is formed,
the extended wire pattern forming step being a step in which the extended wire pattern is formed on a front surface of the passivation layer or at a position apart from the front surface of the passivation layer,
wherein
the extended wire pattern forming step includes:
a first metal layer forming step in which a first metal layer connected to the first electrode and the second electrode is formed; and
a second metal layer forming step in which a second metal layer is formed on a front surface of the first metal layer by plating using the first metal layer formed in the first metal layer forming step as a power supply layer, and
wherein the extended wire pattern extends outside only from one end side of the optical semiconductor chip;
in the optical element forming step, a plurality of chip regions in which the optical semiconductor chips are formed are arranged on the semiconductor substrate; and
in at least two chip regions adjacent to each other, the optical elements are formed such that extended wire arrangement ends each being one end of the optical semiconductor chip in which the extended wire pattern extends outward face each other.

7. The method for producing optical semiconductor device according to claim 6, wherein the optical element forming step includes a separation groove forming step in which a chip separation groove is formed by dry etching between the chip regions where the extended wire arrangement ends are adjacent to each other.

8. The method for producing optical semiconductor device according to claim 7, wherein in the extended wire pattern forming step, the extended wire pattern of the optical semiconductor chip formed in one chip region is formed to extend beyond the chip separation groove to the optical semiconductor chip formed in another adjacent chip region.

9. The method for producing optical semiconductor device according to claim 8, wherein
the optical semiconductor chip is provided with a semiconductor laser formed as the optical element;
a rear end face of the semiconductor laser opposite to a laser light emission side is a side face of the chip separation groove formed in the separation groove forming step; and
the optical element forming step includes a rear end face reflection film forming step in which the rear end face of the semiconductor laser is coated with a reflection film for reflecting the laser light after the separating groove forming step.

10. The method for producing optical semiconductor device according to claim 7, wherein
the optical semiconductor chip is provided with a semiconductor laser formed as the optical element;
a rear end face of the semiconductor laser opposite to a laser light emission side is a side face of the chip separation groove formed in the separation groove forming step; and
the optical element forming step includes a rear end face reflection film forming step in which the rear end face of the semiconductor laser is coated with a reflection film for reflecting the laser light after the separating groove forming step.

* * * * *